(12) United States Patent
Fukushige et al.

(10) Patent No.: US 6,846,605 B2
(45) Date of Patent: Jan. 25, 2005

(54) PHOTOPOLYMERIZABLE COMPOSITION AND RECORDING MATERIAL USING SAME

(75) Inventors: Yūuichi Fukushige, Shizuoka-ken (JP); Yoshimitsu Arai, Shizuoka-ken (JP); Masatoshi Yumoto, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 71 days.

(21) Appl. No.: 10/421,905

(22) Filed: Apr. 24, 2003

(65) Prior Publication Data

US 2003/0224294 A1 Dec. 4, 2003

(30) Foreign Application Priority Data

May 1, 2002 (JP) ........................................ 2002-129772

(51) Int. Cl.[7] .......................... G03F 7/029; G03F 7/105
(52) U.S. Cl. .................... 430/138; 430/281.1; 430/914; 430/926
(58) Field of Search .................. 430/138, 281.1, 430/914, 926

(56) References Cited

U.S. PATENT DOCUMENTS

| | | | | |
|---|---|---|---|---|
| 5,091,280 A | * | 2/1992 | Yamaguchi et al. | 430/138 |
| 5,100,755 A | * | 3/1992 | Shanklin | 430/138 |
| 5,346,801 A | * | 9/1994 | Watanabe et al. | 430/253 |
| 5,945,152 A | * | 8/1999 | Purser | 426/646 |
| 6,045,974 A | * | 4/2000 | Cunningham et al. | 430/281.1 |

FOREIGN PATENT DOCUMENTS

| | | |
|---|---|---|
| JP | A-52-89915 | 7/1977 |
| JP | A-60-119552 | 6/1985 |
| JP | A-61-123838 | 11/1986 |
| JP | A-3-87827 | 4/1991 |
| JP | A-4-211252 | 8/1992 |

* cited by examiner

*Primary Examiner*—Richard L. Schilling
(74) *Attorney, Agent, or Firm*—Taiyo, Nakajima & Kato

(57) ABSTRACT

The present invention provides a photopolymerizable composition and a recording material using the photopolymerizable composition, which contains a polymerizable compound having an ethylenic unsaturated group, an organic borate and a cationic compound that interacts with the organic borate. The organic borate is represented by the following formula (1) wherein $R^1$ represents an alkyl group, $R^2$ represents an electron-donating group, $R^3$ to $R^6$ each represent a hydrogen atom or a substituent, the sum of Hammett's substituent constants σ of $R^2$ to $R^6$ is 0 to 1, and $Z^+$ represents a group that can form a cation. The organic borate has a melting point of no more than 100° C.

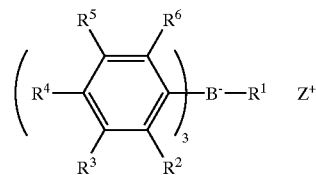

Formula (1)

21 Claims, No Drawings

PHOTOPOLYMERIZABLE COMPOSITION AND RECORDING MATERIAL USING SAME

BACKGROUND OF THE INVENTION

1. Field of the Invention

The present invention relates to a photopolymerizable composition and a recording material using the same, and particularly, to a photopolymerizable composition possessing excellent sensitivity, storage stability and photo-decolorizability, and a recording material using the same.

2. Description of the Related Art

Various dry-type image-recording methods that do not use liquid developers and which produce no waste have been studied. Among such methods, a method using a photocurable composition has attracted much attention.

In this method, the photocurable composition contained in a recording material is hardened by exposing the recording material to form a latent image, and components for causing a coloring or decoloring reaction contained in an unexposed portion move by heating the recording material to form a colored image. The recording material is first exposed to light through an image draft copy, and the exposed portion is cured to form a latent image. Thereafter, by heating the recording material, components in the uncured portion (unexposed portion) move and react, thereby forming a visible image.

This method enables formation of a completely dry system that produces no waste.

Although this method can be used for recording monochrome images, it is particularly useful for recording color images. Various types of recording materials can be used for the method, a specific example being a 2-component type light and heat sensitive color-developing recording material disclosed in Japanese Patent Application Laid-Open (JP-A) No. 52-89915. This recording material is a thermosensitive color-developing type recording material, in which an electron-accepting compound and an electron-donating colorless dye are used as the two components, and which contains a photocurable composition inside and/or outside of the microcapsules.

However, even if the photocurable composition contained in the microcapsules is sufficiently cured, color development in the cured portion cannot be adequately controlled and the non-image portion tends to be colored, thereby reducing the level of contrast.

An example of a recording material capable of forming an image without color development in the non-image portion is disclosed in JP-A No. 61-123838. In the recording material, a layer containing a photopolymerizable composition including a vinyl monomer with an acidic group and a photoinitiator, a separating layer, and a layer including an electron-donating colorless dye are layered.

In this recording material, the acidic group is not thermally diffusive and thus color does not develop in the non-image portion cured by the photopolymerization reaction. However, a disadvantage is that color density is somewhat low.

A recording material disclosed in JP-A No. 60-119552 forms a negative image in the same manner. In the recording material, a photopolymerizable composition, including a monomer or prepolymer, which is for bleaching a dye, and a photoinitiator, is isolated from a dye to be bleached by the monomer or prepolymer. However, this recording material has the same disadvantage of low color density as observed in the above-mentioned recording material, despite the fact that the non-image portion is left uncolored.

In view of the above disadvantages, the applicant has proposed recording materials in JP-A Nos. 3-87827 and 4-211252, which exhibit reduced color development in the non-image portion and high color density. The recording material disclosed in JP-A No. 3-87827 is a 2-component type light and heat sensitive color-developing recording material, in which one of the two components is enclosed in microcapsules, and the other is used as a curable compound of the photocurable composition or contained on the exterior of the microcapsules with the photocurable composition. The recording material disclosed in JP-A No. 4-211252 is a light and heat sensitive recording material, in which microcapsules enclosing an electron-donating colorless dye, and a photocurable composition, disposed on the exterior of the microcapsules, containing an electron-accepting compound, a polymerizable vinyl monomer and a photoinitiator are applied to form a layer.

To record a color image on such light and heat sensitive recording materials, a plurality of recording layers which have different photosensitive wavelengths and produce different colors are layered on a support.

The above-mentioned recording materials proposed by the applicant are examples of multicolor, light and heat sensitive recording materials. Specifically, in the multicolor material, a 1st recording layer that is sensitive to light with a center wavelength $\lambda_1$ to produce a 1st color; an intermediate layer absorbing the light with the center wavelength $\lambda_1$; a 2nd recording layer that is sensitive to light with a center wavelength $\lambda_2$ to produce a 2nd color different from the 1st color; ...; an intermediate layer absorbing light with a center wavelength $\lambda_{i-1}$; and an i-th recording layer that is sensitive to light with a center wavelength $\lambda_i$ to produce an i-th color different from the 1st, 2nd, ..., and i−1-th colors; are layered in this order from the exposure light source side to the support. In this case, i is 2 or more, and an inequality of the center wavelength $\lambda_1 < \lambda_2 < \ldots < \lambda_i$ is satisfied.

Although the recording materials can be used for various purposes, image recording can be performed with a light source using ultraviolet or short wave visible light, but not with a compact and inexpensive, infrared laser or blue to red light source.

In a case where a compact and inexpensive, infrared laser or blue to red light source is used, the recording layer needs to contain a dye that can absorb each irradiated light in an ultraviolet to infrared region to form a fine image at high speed. However, when a dye that absorbs visible light is used, the background portion undergoes coloring, thereby resulting in a low quality image with poor contrast. On the other hand, when a dye that absorbs near-infrared light is used, the laser light source corresponding to the dye is expensive, although coloring in the background portion can be reduced.

SUMMARY OF THE INVENTION

An object of the present invention is to solve the conventional problems, thereby providing a photopolymerizable composition possessing excellent photopolymerization sensitivity, storage stability and photo-decolorizability.

Another object of the invention is to provide a unicolor or multicolor recording material, which is completely dry-processed without a liquid developer, produces no waste, forms a high-quality image possessing excellent contrast by a blue to red laser or a compact inexpensive infrared laser and is excellent in sensitivity and storage stability.

As a result of intense research with respect to a structure of an organic borate to be contained in a photopolymerizable composition that is photopolymerized and hardened, the inventors have found that photopolymerization sensitivity, storage stability and photo-decolorizability of the photopolymerizable composition are improved by using an organic borate having a particular structure and a melting point of no more than 100° C., and that a recording material comprising a light and heat sensitive recording layer including this photopolymerizable composition is high in sensitivity, contrast and storage stability. The invention has been accomplished by the findings.

Further, the recording material including the photopolymerizable composition can easily produce an image possessing excellent whiteness of a non-image portion and excellent contrast, because the image can be fixed and the photo-decolorizability of a colored component remaining in the recording layer can be increased by further irradiating the recording layer after image formation.

A first aspect of the invention is a photopolymerizable composition comprising a polymerizable compound having an ethylenic unsaturated group, an organic borate represented by the following formula (1) and having a melting point of no more than 100° C., and a cationic compound that interacts with the organic borate.

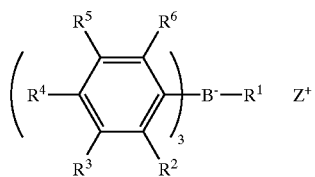

Formula (1)

In formula (1), $R^1$ represents an alkyl group, $R^2$ represents an electron-donating group, $R^3$ to $R^6$ each represent a hydrogen atom or a substituent, the sum of Hammett's substituent constants σ of $R^2$ to $R^6$ is 0 to 1, and $Z^+$ represents a group that can form a cation.

A second aspect of the invention is a recording material comprising a support, and a light and heat sensitive recording layer containing a color-developing component encapsulated in heat-responsive microcapsules and a photopolymerizable composition on the exterior of the heat-responsive microcapsules, wherein said photopolymerizable composition comprises a substantially colorless polymerizable compound having an ethylenic unsaturated group and a moiety that reacts with the color-developing component to form a color, an organic borate represented by the following formula (1) and having a melting point of no more than 100° C., and a cationic compound that interacts with the organic borate.

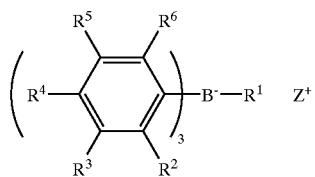

Formula (1)

In formula (1), $R^1$ represents an alkyl group, $R^2$ represents an electron-donating group, $R^3$ to $R^6$ each represent a hydrogen atom or a substituent, the sum of Hammett's substituent constants σ of $R^2$ to $R^6$ is 0 to 1, and $Z^+$ represents a group that can form a cation.

The organic borate can provide the recording material possessing excellent sensitivity, color density, background portion density, and storage stability (crystal precipitation).

DETAILED DESCRIPTION OF THE PREFERRED EMBODIMENTS

A photopolymerizable composition of the present invention comprises an organic borate represented by the following formula (1) and having a melting point of no more than 100° C., a polymerizable compound having an ethylenic unsaturated group, and a cationic compound that interacts with the organic borate.

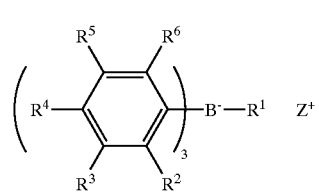

Formula (1)

In formula (1), $R^1$ represents an alkyl group, $R^2$ represents an electron-donating group, $R^3$ to $R^6$ each represent a hydrogen atom or a substituent, the sum of Hammett's substituent constants σ of $R^2$ to $R^6$ is 0 to 1, and $Z^+$ represents a group that can form a cation.

A recording material of the invention is obtainable by forming a light and heat sensitive recording layer containing heat-responsive microcapsules enclosing a color-developing component and the photopolymerizable composition of the invention on a support. In the photopolymerizable composition of the recording material, the polymerizable compound is substantially colorless and has, in a same molecule, the ethylenic unsaturated group and a moiety that reacts with the color-developing component to form a color.

The photopolymerizable composition of the invention and the recording material of the invention including the composition will be described in detail below.

Photopolymerizable Composition

The photopolymerizable composition of the invention includes the organic borate, which is represented by the following formula (1) and has the melting point of no more than 100° C.

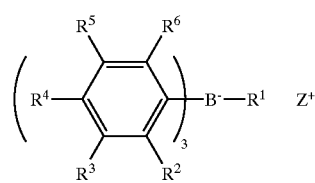

Formula (1)

In formula (1), $R^1$ represents an alkyl group, $R^2$ represents an electron-donating group, $R^3$ to $R^6$ each represent a hydrogen atom or a substituent, the sum of Hammett's substituent constants σ of $R^2$ to $R^6$ is 0 to 1, and $Z^+$ represents a group that can form a cation.

In formula (1), $R^1$ represents an alkyl group. The alkyl group of $R^1$ may be substituted or unsubstituted, and examples of a substituent thereon include a halogen atom, aryl groups, alkenyl groups, alkynyl groups, alkoxy groups, aryloxy groups, alkoxycarbonyl groups, acyloxy groups, acylamino groups, carbamoyl groups, cyano groups, alkylsulfenyl groups, arylsulfenyl groups, alkylsulfinyl groups, arylsulfinyl groups, alkylsulfonyl groups, arylsulfonyl groups, sulfonamide groups, sulfamoyl groups, carboxy groups, sulfonate groups, acyl groups, silyl groups, and heterocyclic groups.

$R^1$ is preferably an alkyl group totally having 1 to 30 carbon atoms, such as a methyl group, an ethyl group, an isopropyl group, a butyl group, a hexyl group, an octyl group, a decyl group, a dodecyl group, a cyclopentyl group, an allyl group, a propargyl group, a cyclohexyl group, a 2-chloroethyl group, a 2-methoxyethyl group, a 2-phenoxyethyl group, a 2-benzoyloxyethyl group, a 2-cyanoethyl group, an ethoxycarbonylmethyl group, a 2-ethoxycarbonylethyl group, an N,N-dibutylcarbamoylmethyl group, a benzyl group, an α-methylbenzyl group and a 4-methylbenzyl group. Among them, an alkyl group totally having 1 to 12 carbon atoms and a benzyl group are more preferable.

In formula (1), $R^2$ represents an electron-donating group. The electron-donating group has a Hammett's substituent constant $\sigma_P$ of a negative value.

The electron-donating group may be an alkyl group, or an alkoxy group specifically. The alkyl group and the alkoxy group may be substituted or unsubstituted, and examples of the substituent thereon include halogen atoms, aryl groups, alkenyl groups, alkynyl groups, alkoxy groups, aryloxy groups, alkoxycarbonyl groups, acyloxy groups, acylamino groups, carbamoyl groups, cyano groups, alkylsulfenyl groups, arylsulfenyl groups, alkylsulfinyl groups, arylsulfinyl groups, alkylsulfonyl groups, arylsulfonyl groups, sulfonamide groups, sulfamoyl groups, carboxy groups, sulfonate groups, acyl groups, and heterocyclic groups. The alkyl group and the alkoxy group have preferably 1 to 30 carbon atoms, respectively.

In formula (1), $R^3$ to $R^6$ each represent a hydrogen atom or a substituent. The sum of Hammett's substituent constants σ of $R^2$ to $R^6$ is preferably 0 to 1.

Examples of the substituent represented by each of $R^3$ to $R^6$ include halogen atoms, alkyl groups, aryl groups, alkenyl groups, alkynyl groups, alkoxy groups, aryloxy groups, alkoxycarbonyl groups, acyloxy groups, acylamino groups, carbamoyl groups, cyano groups, alkylsulfenyl groups, arylsulfenyl groups, alkylsulfinyl groups, arylsulfinyl groups, alkylsulfonyl groups, arylsulfonyl groups, sulfonamide groups, sulfamoyl groups, carboxy groups, sulfonate groups, acyl groups, silyl groups, and heterocyclic groups. These atoms and groups may further have a substituent.

The substituents of $R^3$ to $R^6$ may be selected such that the sum of the Hammett's substituent constants a of $R^2$ to $R^6$ is 0 to 1.

The sum of the Hammett's substituent constants σ of $R^2$ to $R^6$ (hereinafter referred to as "sum of σ") is preferably 0 to 1, particularly preferably 0.1 to 0.6.

When the sum of σ is more than 1, electron-withdrawing properties of $R^2$ to $R^6$ is so strong that the sensitivity of the photopolymerizable composition is reduced, which is not preferable. On the other hand, when the sum of σ is 0.1 to 0.6, the photopolymerizable composition is high in the sensitivity and exhibits a sufficient stability in an acid-containing medium, which is preferable.

The Hammett's substituent constant σ is explained in detail in Naoki Inamoto, *Hammett Soku-Kozo to Hannosei-*, Maruzen; *Shin Jikken Kagaku Koza 14, Yuki Kagobutsu no Gosei to Hanno V*, Page 2605, Edited by The Chemical Society of Japan, Maruzen; Tadao Nakaya, *Riron Yuki Kagaku Kaisetsu*, Page 217, Tokyo Kagaku Dojin; and *Chemical Review*, Vol. 91, Page 165 to 195, 1991.

Further, it is preferred that $R^3$ or $R^5$ is a fluorinated organic borate to obtain sufficient storage stability.

In formula (1), $Z^+$ represents a group that can form a cation, and may be, for example, an alkaline metal (particularly lithium or sodium), an alkaline earth metal, a transition metal, a quaternary ammonium such as a tetralkyl ammonium, a dye cation, or a cationic transition metal coordination complex compound. A tetralkyl ammonium represented by the following formula (2) is preferable among these.

$$N^+R^7R^8R^9R^{10} \qquad \text{Formula (2)}$$

In formula (2), $R^7$ to $R^{10}$ independently represent a hydrocarbon group, and the sum of carbon atoms of $R^7$ to $R^{10}$ is at least 20.

There are no particular restrictions as to the hydrocarbon groups of $R^7$ to $R^{10}$ as long as they have at least one carbon atom and the sum of carbon atoms thereof is at least 20.

Thus, $R^7$ to $R^{10}$ on the nitrogen atom may be the same or different groups, and a tetralkyl ammonium can be used in which the group represented by each of $R^7$ to $R^{10}$ may asymmetrically connect to the nitrogen atom.

Examples of the hydrocarbon group include aliphatic hydrocarbon group such as a methyl group, an ethyl group, a pentyl group, a hexyl group, a heptyl group, an octyl group, a decyl group, a dodecyl group, a pentadecyl group and an octadecyl group; aromatic hydrocarbon groups such as a phenyl group, a benzyl group, a styryl group and a naphthyl group; and alicyclic hydrocarbon groups such as a cyclopropyl group, a cyclopentyl group, a cyclohexyl group and a 1-cyclohexenyl group.

Further, $R^7$ to $R^{10}$ may be an unsubstituted hydrocarbon group or a hydrocarbon group having a substituent, respectively.

Examples of the substituent on the hydrocarbon group include a hydroxyl group, halogen groups, a cyano group, a nitro group, a methacryloyl group, and an acryloyl group.

As each of the hydrocarbon group represented by $R^7$ to $R^{10}$, those having a longer carbon chain length is preferred and it is more preferred that at least one of $R^7$ to $R^{10}$ is a group having a long chain length, from the viewpoint of a group which can form a cation which contains $R^7$ to $R^{10}$ being able to easily bind to an anion moiety of the cationic compound to be hereinafter described so as to improve the photopolymerization sensitivity and the photo-decolorizability. It is particularly preferred that $R^7$ to $R^{10}$ are the groups with long chain length and each of $R^7$ to $R^{10}$ has the same chain length or is a group whose raw materials are easily available, from the viewpoints of synthesis, cost, and solubility.

In the invention, it is preferable to use a group which can form a cationic group in which the sum of the carbon atoms of $R^7$ to $R^{10}$ is at least 20. The sum is preferably no more than 70, more preferably no more than 60, and the most preferably no more than 50.

When the sum of the carbon atoms exceeds 70, coatability may be worsened, which is not preferable for production.

Specific examples of the tetralkyl ammonium having at least 20 carbon atoms include tetrapentyl ammonium, tetrahexyl ammonium, tetraheptyl ammonium, tetraoctyl ammonium, tetradecyl ammonium, tetradodecyl ammonium, and methyl trioctyl ammonium. Among them, particularly preferred are tetrapentyl ammonium, tetrahexyl ammonium, tetraoctyl ammonium and methyl trioctyl ammonium.

The organic borate includes a boron atom-containing anion component which releases a radical, thereby acting as a photoinitiator promoting the polymerization reaction. Additionally, the organic borate decolorizes a colored component such as the cationic compound that interacts with the organic borate in the photopolymerizable composition.

The organic borate used in the invention is represented by formula (1) and has the melting point of no more than 100° C. The melting point is particularly preferably no more than 80° C. The storage stability of the photopolymerizable composition can be improved by the organic borate having the low melting point while maintaining the sensitivity of the composition and the decolorizability of the dye component.

The melting point of the organic borate used in the invention may be measured by a differential scanning calorimetry (DSC).

The organic borate of formula (1) used in the invention (hereinafter referred to as "organic borate product") may be easily synthesized, for example, by a reaction between an organic borate (hereinafter referred to as "organic borate starting material"), which has a melting point of at least 120° C. and the same boron atom-containing anion component as that of the organic borate product, and can be easily purified by recrystallization, and an ionic compound having a cation moiety convertable to the cation contained in the organic borate product.

The organic borate starting material is represented by the following formula (3), and has the melting point of at least 120° C.

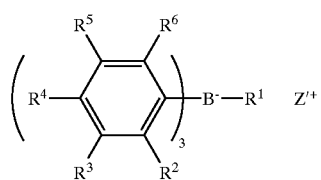

Formula (3)

Wherein, $R^1$ to $R^6$ are the same as those in formula (1).

$Z'^+$ represents a group that can form a cation, different from $Z^+$ in formula (1). The group represented by $Z'^+$ is not particularly limited, and examples thereof include alkaline metals (particularly lithium and sodium), alkaline earth metals, transition metals, quaternary ammoniums such as tetralkyl ammoniums, dye cations, and cationic transition metal coordination complex compounds. Among them, preferred are alkaline metals such as Li, Na and K, and tetralkyl ammoniums totally having no more than 16 carbon atoms such as tetrabutyl ammonium, tetramethyl ammonium, tetraethyl ammonium and tetrapropyl ammonium. Particularly preferred are tetralkyl ammoniums totally having no more than 16 carbon atoms.

The ionic compound has a group that can form the cation of the organic borate product, and an anion moiety. The group and the anion moiety form an ionic bond as represented by the following formula (4).

$$X^-Z^+$$  Formula (4)

In formula (4), $Z^+$ is the same as that of formula (1) with respect to the meanings, examples and preferred embodiments.

$X^-$ represents an anion. There are no particular restrictions as to the anion for the anion moiety. Examples of the anion include $Br^-$, $Cl^-$, $ClO_4^-$, and $TsO^-$.

In the synthesis of the organic borate product, the reaction between the organic borate starting material and the ionic compound is carried out in a two-phase of water and an organic solvent.

Though the organic borate product having the low melting point is generally difficult to purify, the organic borate product can be synthesized with high purity and high yield by using an organic borate high in purity as a starting material, and by subjecting the starting material to an ion-exchange reaction in the two-phase of water and an organic solvent.

Typical examples of the organic solvent include esters such as ethyl acetate and isopropyl acetate; ethers such as diethyl ether; and hydrocarbons such as toluene, xylene and hexane. Particularly preferred is ethyl acetate.

In the ion-exchange reaction, the reaction temperature is preferably 0° C. to a reflux temperature of the organic solvent, and the reaction time is preferably 2 to 6 hours.

The amount (weight) of the organic solvent used is preferably 1 to 1000 times as much by weight as that of the organic borate starting material, and preferably 0.1 to 10 times as much as that of water.

Synthesis examples of the organic borate represented by formula (1) and having the melting point of no more than 100° C. will be described below.

Synthesis Example 1

6.66 g of the following organic borate A having a melting point of 121° C. and 4.35 g of tetrahexyl ammonium bromide were added to a mixture of 100 ml of ethyl acetate and 100 ml of water, and the resultant mixture was stirred at room temperature for 2 hours. The mixture separated into two phases, and then the ethyl acetate phase was concentrated to prepare 7.70 g of the following organic borate 1 (yield: 99%, melting point: <25° C.).

Organic borate A

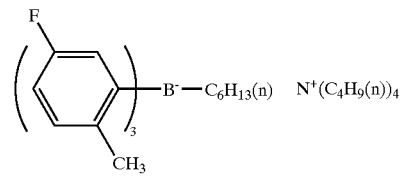

Organic borate 1

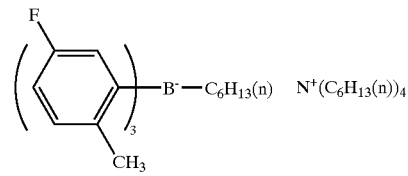

Synthesis Example 2

20 g of the organic borate A and 12.14 g of methyl trioctyl ammonium chloride were added to a mixture of 100 ml of ethyl acetate and 100 ml of water, and the resultant mixture was stirred at room temperature for 2 hours. The mixture separated into two phases, and then the ethyl acetate phase was concentrated to prepare 23.79 g of the following organic borate 2 (yield: 100%, melting point: 55° C.).

Organic borate 2

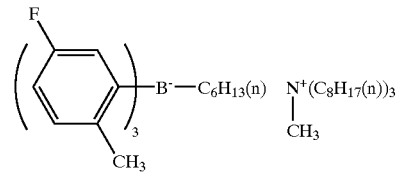

Specific examples of the organic borate contained in the photopolymerizable composition of the invention, represented by formula (1) and having the melting point of no more than 100° C., are illustrated below without intention of restricting the scope of the invention.

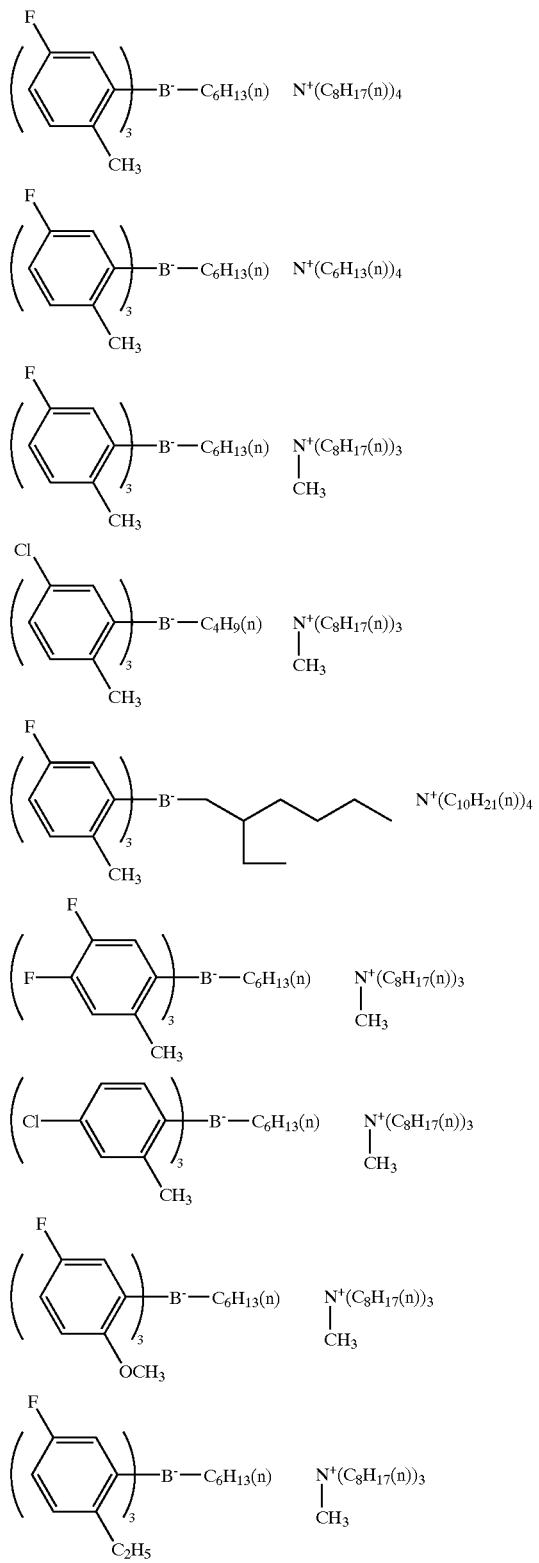

For the photopolymerizable composition of the invention, the organic borate may be used alone, and a plurality of the organic borates may be used in combination.

The mass ratio of the organic borate to the radical-polymerizable compound to be hereinafter described is preferably 1 to 20 mass %, and more preferably 4 to 15 mass %, in the photopolymerizable composition of the invention.

When the mass ratio is less than 1 mass %, the polymerization activity or the decolorizability is often reduced. On the other hand, when the mass ratio is more than 20 mass %, the storage stability may be reduced.

A photoinitiator other than the organic borate represented by formula (1) may be added to the photopolymerizable composition of the invention, as long as the photoinitiator does not ruin the effects of the invention.

Examples of the photoinitiator other than the organic borate include aromatic ketones such as benzophenone, 4,4-bis(dimethylamino)benzophenone, 4-methoxy-4'-dimethylaminobenzophenone, 4,4'-dimethoxybenzophenone, 4-dimethylaminobenzophenone, 4-dimethylaminoacetophenone, benzylanthraquinone, 2-tert-butylanthraquinone, 2-methylanthraquinone, xanthone, thioxanthone, 2-chlorothioxanthone, 2,4-diethylthioxanthone, fluorenone, acridone, bisacylphosphine oxides (e.g. bis(2,4,6-trimethylbenzoyl)-phenylphosphine oxide) and acylphosphine oxides (e.g. 2,4,6-trimethylbenzoyl-diphenylphosphine oxide); benzoin and benzoin ethers such as benzoin methyl ether, benzoin ethyl ether, benzoin isopropyl ether and benzoin phenyl ether; 2,4,6-triarylimidazole dimers such as 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer and 2-(p-methoxyphenyl)-4,5-diphenylimidazole dimer; polyhalogenated compounds such as carbon tetrabromide, phenyl tribromomethyl sulfone and phenyl trichloromethyl ketone; compounds described in JP-A No. 59-133428, Japanese Patent Application Publication (JP-B) Nos. 57-1819 and 57-6096, and U.S. Pat. No. 3,615,455; S-triazine derivatives having a trihalogenated methyl group, described in JP-A No. 58-29803, such as 2,4,6-tris(trichloromethyl)-S-triazine, 2-methoxy-4,6-bis(trichloromethyl)-S-triazine, 2-amino-4,6-bis(trichloromethyl)-S-triazine and 2-(p-methoxystyryl)-4,6-bis(trichloromethyl)-S-triazine; organic peroxides described in JP-A No. 59-189340, such as methyl ethyl ketone peroxide, cyclohexanone peroxide, 3,3,5-trimethylcyclohexanone peroxide, benzoyl peroxide, di-tert-butyl diperoxyisophthalate, 2,5-dimethyl-2,5-di(benzoylperoxy)hexane, tert-butyl peroxybenzoate, a,a'-bis(tert-butylperoxyisopropyl)benzene, dicumylperoxide and 3,3',4,4'-tetra-(tert-butylperoxycarbonyl)benzophenone; azinium salt compounds described in U.S. Pat. No. 4,743,530; organic boron compounds described in EP No. 0,223,587, such as a tetramethyl ammonium salt of triphenylbutylborate, a tetrabutyl ammonium salt of triphenylbutylborate, and tetramethyl ammonium salt of tri(p-methoxyphenyl)butylborate; diaryl iodonium salts; and iron-allene complexs.

Photoinitiators comprising a combination of a plurality of compounds are known, and may be used for the photopolymerizable composition of the invention.

Examples of the combination of a plurality of compounds include combinations of 2,4,5-triarylimidazole dimer and mercaptobenzoxazole; combinations of 4,4'-bis(dimethylamino)benzophenone, and benzophenone or benzoin methyl ether, described in U.S. Pat. No. 3,427,161; a combination of benzoyl-N-methylnaphthothiazoline and 2,4-bis(trichloromethyl)-6-(4'-methoxyphenyl)-triazole, described in U.S. Pat. No. 4,239,850; combinations of dialkylaminobenzoic acid ester and dimethylthioxanthone, described in JP-A No. 57-23602; and combinations of 4,4'-bis(dimethylamino)benzophenone and benzophenone and polyhalogenated methyl compound described in JP-A No. 59-78339.

An organic borate other than the organic borate represented by formula (1) may be added to the photopolymerizable composition as a photoinitiator, as long as it does not ruin the effects of the invention.

Examples of such an organic borate include organic borates described in JP-A Nos. 62-143044, 9-188685, 9-188686 and 9-188710; and spectrally sensitizing dye borate compounds derived from cationic dyes.

The cationic compound, which is contained in the photopolymerizable composition of the invention and interacts with the organic borate, will be described below.

The cationic compound may be a dye having a particular maximum absorption wavelength. Such a cationic compound can effectively absorb light energy of the irradiated light, and as a result, it can increase the sensitivity and can electrostatic-interact with the organic borate to effectively promote radical generation.

When the organic borate is exposed to light, its chemical bond is broken and thereby each free radical of the cation component and the counter anion component is generated. The cationic compound causes the electrostatic interaction with the free radical of the cation component, to increase the connectivity.

In the case where the cation component of the organic borate totally has at least 20 carbon atoms as described above, the organic borate is lipophilic with lipophilicity of the cation component. Particularly in this case, the cation component free radical generated by irradiation strongly electrostatic-interacts with the anion moiety of the cationic compound, whereby the cation component of the organic borate easily connects to the anion moiety.

Thus, the borate radical of the anion component of the organic borate, which is dissociated by irradiation, is effectively generated, to improve the photopolymerization sensitivity and the photo-decolorizability of the photopolymerizable composition.

Examples of the cationic compound include known cationic dyes and diazonium salt compounds.

Preferred as the cationic dye are spectrally sensitizing dyes having a maximum absorption wavelength of 300 to 1000 nm. The absorption wavelength may be controlled suitably for a light source. In a case where a spectrally sensitizing dye suitable for the light source wavelength is used, the photopolymerization sensitivity of the photopolymerizable composition can be increased and controlled suitably for a light in the ultraviolet to infrared region. Thus, a blue, green or red light source, and an infrared laser may be used for image exposure in this case.

To form a color image by a multicolor recording material, in which unicolor recording layers for producing a different color are layered, each of the spectrally sensitizing dyes having a different absorption wavelength may be added to each unicolor recording layer. The light source for each unicolor recording layer may be selected depending on the absorption wavelength of the spectrally sensitizing dye, and thereby each recording layer (or each color) can form a sharp image with high sensitivity in the multilayered, multicolor recording material. Thus, entire multicolor recording material can form the color image with high sensitivity and sharpness.

The spectrally sensitizing dye may be appropriately selected from known compounds described in patents to be hereinafter mentioned for "a compound that interacts a spectral sensitization compound," *Research Disclosure*, Vol. 200, Item 20036, December 1980, and *Zokanzai*, Page 160 to 163, Edited by Katsumi Tokumaru and Shin Ogawara, Kodansha Co., Ltd., 1987.

Specific examples of the spectrally sensitizing dye include 3-ketocoumarin compounds described in JP-A No. 58-15603; thiopyrylium salts described in JP-A No. 58-40302; naphthothiazole merocyanine compounds described in JP-B Nos. 59-28328 and 60-53300; and merocyanine compounds described in JP-B Nos. 61-9621 and 62-3842, and JP-A Nos. 59-89303 and 60-60104.

The specific examples further include dyes described in *Kinosei Shikiso no Kagaku*, Page 393 to 416, CMC Publishing Co., 1981, and *Shikizai*, 60 [4], Page 212 to 224, 1987, such as cationic methine dyes, cationic carbonium dyes, cationic quinone imine dyes, cationic indoline dyes and cationic styryl dyes.

The spectrally sensitizing dye may be selected from keto dyes such as coumarin dyes including ketocoumarin dyes and sulfonocoumarin dyes, merostyryl dyes, oxonol dyes and hemioxonol dyes; non-keto dyes such as non-keto polymethine dyes, triarylmethane dyes, xanthene dyes, anthracene dyes, rhodamine dyes, acridine dyes, aniline dyes and azo dyes; non-keto polymethine dyes such as azomethine dyes, cyanine dyes, carbocyanine dyes, dicarbocyanine dyes, tricarbocyanine dyes, hemicyanine dyes and styryl dyes; and quinone imine dyes such as azine dyes, oxazine dyes, thiazine dyes, quinoline dyes and thiazole dyes.

The spectrally sensitizing dyes may be used alone or in combination with each other.

The amount of the spectrally sensitizing dye is preferably 0.05 to 1 parts by mass, more preferably 0.1 to 0.3 parts by mass, per part by mass of the organic borate, which is represented by formula (1) and has the melting point of no more than 100° C.

When the amount is less than 0.05 parts by mass, the spectrally sensitizing dye often cannot absorb the light energy of the light source sufficiently and the radical generation is suppressed, thereby failing to obtain sufficient photopolymerization sensitivity and photo-decolorizability. When the amount is more than 1 part by mass, the incident light cannot sufficiently penetrate, and thereby the photopolymerization sensitivity is reduced or the decolorization is insufficient in some cases.

The diazonium salt compound may be appropriately selected from compounds described in JP-A No. 2000-199952 as a color-developing component.

The polymerizable compound having an ethylenic unsaturated group, contained in the photopolymerizable composition of the invention, will be described below.

The polymerizable compound has an ethylenic unsaturated double bond. The polymerizable compound is photopolymerized while accepting the radical generated from the organic borate by irradiation, to harden the film.

Examples of the polymerizable compound having an ethylenic unsaturated group include photopolymerizable monomers and compounds having a polymerizable group to be hereinafter described.

The photopolymerizable monomer may be appropriately selected from known ones. The photopolymerizable monomer preferably has at least one vinyl group. In the case where the photopolymerizable monomer is used in a recording material including an electron-donating colorless dye as a color-developing component, the photopolymerizable monomer more preferably has a function of inhibiting a color-developing reaction between the electron-donating colorless dye and an electron-accepting compound.

Specific examples of the photopolymerizable monomer include acrylic acid and salts thereof, acrylic esters, acrylamide compounds; methacrylic acid and salts thereof, methacrylic esters, methacrylamide compounds; maleic anhydride, maleic acid esters; itaconic acid, itaconic acid esters; styrene compounds; vinyl ethers; vinyl esters; N-vinyl heterocyclic compounds; aryl ethers; and aryl esters.

The photopolymerizable monomer furthermore preferably has a plurality of vinyl groups. Examples of such a photopolymerizable monomer include acrylic esters and methacrylic esters of polyalcohol compounds such as trimethylolpropane and a pentaerythritol; acrylic esters and methacrylic esters of bisphenol compounds or polyphenol compounds such as resorcinol, pyrogallol and phloroglucinol; epoxy resins having acrylate or methacrylate end; and polyesters having acrylate or methacrylate end.

Among them, particularly preferred are ethylene glycol diacrylate, ethylene glycol dimethacrylate, trimethylolpropane triacrylate, pentaerythritol tetracrylate, dipentaerythritol hydroxypentacrylate, hexanediol-1,6-dimethacrylate, and diethylene glycol dimethacrylate.

The molecular weight of the photopolymerizable monomer is preferably approximately 100 to approximately 5,000, and more preferably approximately 300 to approximately 2,000.

The amount of the photopolymerizable monomer is preferably 5 to 100 parts by mass, and more preferably 10 to 50 parts by mass, per part by mass of the organic borate.

When the amount is less than 5 parts by mass, the density of the produced color is often reduced. When the amount is more than 100 parts by mass, the storage stability is often reduced.

Examples of the compounds having a polymerizable group include electron-accepting compounds having a polymerizable group, and coupler compounds having a polymerizable group.

The compounds may have the polymerizable group and a moiety that reacts with a color-developing component to form a color. In this case, the compound can be photopolymerized to harden the composition and can form a color, thereby particularly suitable for use with the color-developing component coexisting in the composition.

Examples of the electron-accepting compound having a polymerizable group include 3-halo-4-hydroxybenzoic acid described in JP-A No. 4-226455; methacryloxy ethyl esters and acryloxyethyl esters of a benzoic acid compound having a hydroxy group, described in JP-A No. 63-173682; esters derived from a benzoic acid compound having a hydroxy group and hydroxymethylstyrene, described in JP-A Nos. 59-83693, 60-141587 and 62-99190; hydroxystyrene described in EP No. 29323; N-vinylimidazole complexes of a zinc halide described in JP-A Nos. 62-167077 and 62-16708; and compounds that can be synthesized based on electron-accepting compounds described in JP-A No. 63-317558.

The electron-accepting compound having an electron-accepting group and a polymerizable group is preferably a 3-halo-4-hydroxybenzoic acid derivative represented by the following formula.

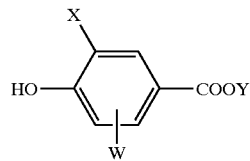

In the formula, X represents a halogen atom, preferably a chlorine atom. Y represents a monovalent group having a polymerizable ethylene group, preferably an aralkyl group having a vinyl group, an acryloyloxyalkyl group or a methacryloyloxyalkyl group, more preferably an acryloyloxyalkyl group having 5 to 11 carbon atoms or a methacryloyloxyalkyl group having 6 to 12 carbon atoms. W represents a hydrogen atom, an alkyl group or an alkoxyl group.

Examples of the 3-halo-4-hydroxybenzoic acid derivative include 3-chloro-4-hydroxybenzoic acid vinylphenethyl ester, 3-chloro-4-hydroxybenzoic acid vinylphenylpropyl ester, 3-chloro-4-hydroxybenzoic acid 2-acryloyloxyethyl ester, 3-chloro-4-hydroxybenzoic acid 2-methacryloyloxyethyl ester, 3-chloro-4-hydroxybenzoic acid 2-acryloyloxypropyl ester, 3-chloro-4-hydroxybenzoic acid 2-methacryloyloxypropyl ester, 3-chloro-4-hydroxybenzoic acid 3-acryloyloxypropyl ester, 3-chloro-4-hydroxybenzoic acid 3-methacryloyloxypropyl ester, 3-chloro-4-hydroxybenzoic acid 4-acryloyloxybutyl ester, 3-chloro-4-hydroxybenzoic acid 4-methacryloyloxybutyl ester, 3-chloro-4-hydroxybenzoic acid 5-acryloyloxypentyl ester, 3-chloro-4-hydroxybenzoic acid 5-methacryloyloxypentyl ester, 3-chloro-4-hydroxybenzoic acid 6-acryloyloxyhexyl ester, 3-chloro-4-hydroxybenzoic acid 6-methacryloyloxyhexyl ester, 3-chloro-4-hydroxybenzoic acid 8-acryloyloxyoctyl ester, and 3-chloro-4-hydroxybenzoic acid 8-methacryloyloxyoctyl ester.

Further, preferred examples of the electron-accepting compound having a polymerizable group include styrenesulfonylaminosalicylic acid, vinylbenzyloxyphthalic acid, zinc β-methacryloxyethoxysalicylate, zinc β-acryloxyethoxysalicylate, vinyloxyethyloxybenzoic acid, β-methacryloxyethylorsellinate, β-acryloxyethylorsellinate, β-methacryloxyethoxyphenol, β-acryloxyethoxyphenol, β-methacryloxyethyl-β-resorcinate, β-acryloxyethyl-β-resorcinate, hydroxystyrenesulfonic acid N-ethylamide, β-methacryloxypropyl p-hydroxybenzoate, β-acryloxypropyl p-hydroxybenzoate, methacryloxymethylphenol, acryloxymethylphenol, methacrylamidopropane sulfonic acid, acrylamidopropane sulfonic acid, β-methacryloxyethoxy-dihydroxybenzene, β-acryloxyethoxy-dihydroxybenzene, γ-styrenesulfonyloxy-β-methacryloxypropanecarboxylic acid, γ-acryloxypropyl-α-hydroxyethyloxysalicylic acid, β-hydroxyethoxycarbonylphenol, β-methacryloxyethyl p-hydroxycinnamate, β-acryloxyethyl p-hydroxycinnamate, 3,5-distyrenesulfonic acid amidophenol, methacryloxyethoxyphthalic acid, acryloxyethoxyphthalic acid, methacrylic acid, acrylic acid, methacryloxyethoxyhydroxynaphthoic acid, acryloxyethoxyhydroxynaphthoic acid, 3-β-hydroxyethoxyphenol, β-methacryloxyethyl p-hydroxybenzoate, β-acryloxyethyl p-hydroxybenzoate, β'-methacryloxyethyl β-resorcinate, β-methacryloxyethyloxycarbonylhydroxybenzoic acid, β-acryloxyethyloxycarbonylhydroxybenzoic acid, N,N'-di-β-methacryloxyethylaminosalicylic acid, N,N'-di-β- acryloxyethylaminosalicylic acid, N,N'-di-β-methacryloxyethylaminosulfonylsalicylic acid, N,N'-di-β-acryloxyethylaminosulfonylsalicylic acid, and metal salts such as zinc salts thereof.

The amount of the electron-accepting compound having a polymerizable group is preferably 10 to 50 parts by mass, and more preferably 20 to 40 parts by mass, per part by mass of the organic borate.

When the amount is less than 10 parts by mass, the density of the produced color is often reduced. When the amount is more than 50 parts by mass, the storage stability is often reduced.

In the case where an electron-donating colorless dye coexists as a color-developing component, the electron-accepting compound having a polymerizable group may be used in combination therewith, whereby a desired latent image may be formed by irradiation and an image may be formed by developing a color in accordance with the latent image.

In this case, the amount of the electron-accepting compound having a polymerizable group is preferably 0.5 to 20 parts by mass, and more preferably 3 to 10 parts by mass, per part by mass of the electron-donating colorless dye.

When the amount is less than 0.5 parts by mass, the density of the produced color is often insufficient. The amount of more than 20 parts by mass often results in reduction in the sensitivity, or degradation in coatability.

Specific examples of the coupler compound having a polymerizable group are illustrated below without intention of restricting the scope of the invention.

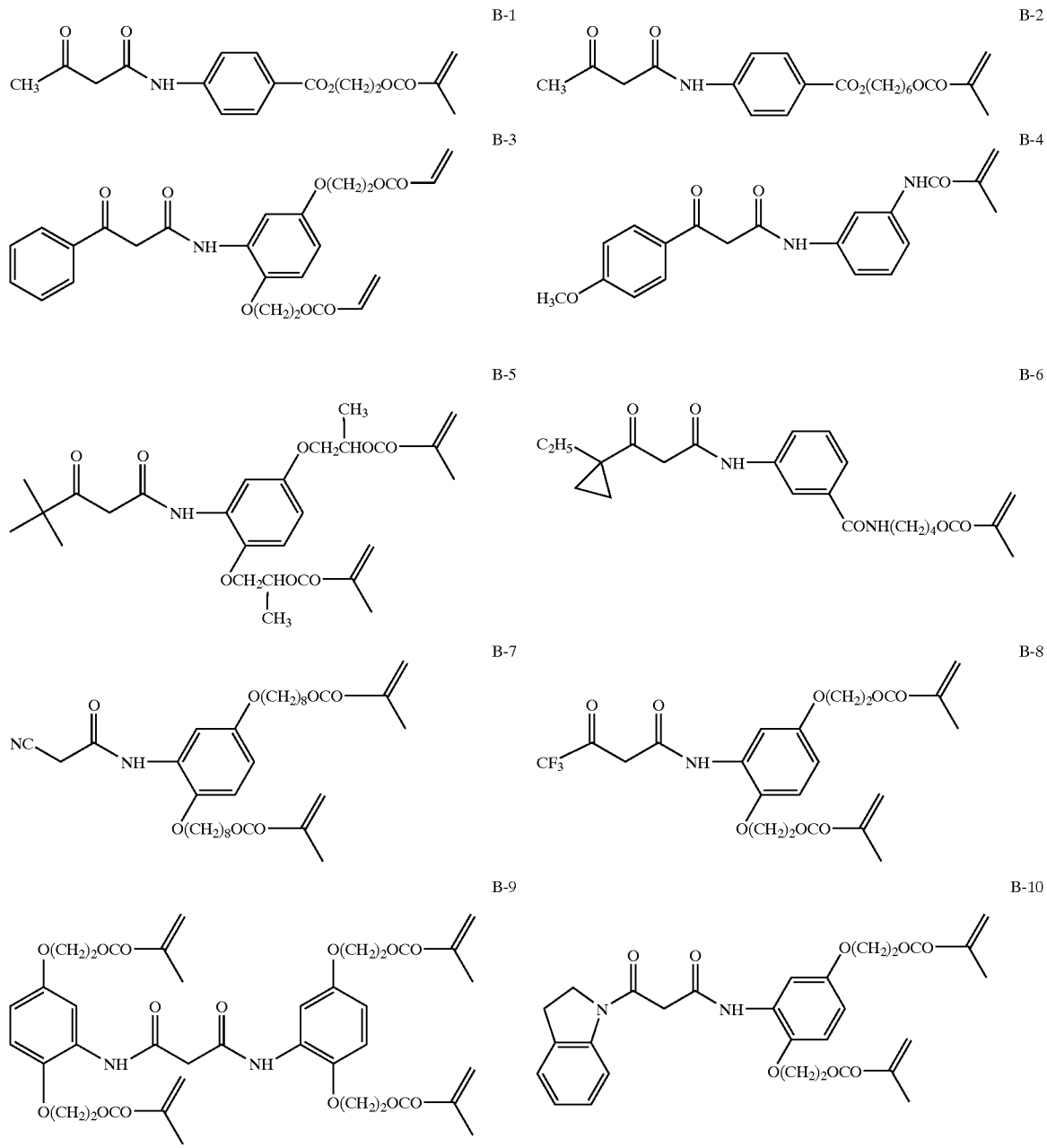

-continued
B-11
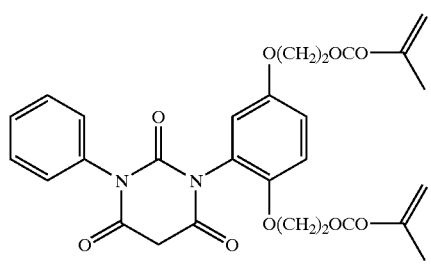
B-12
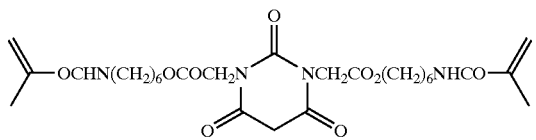
B-13
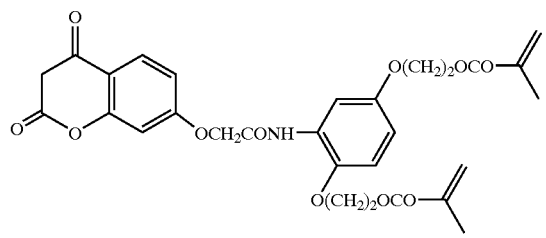
B-14
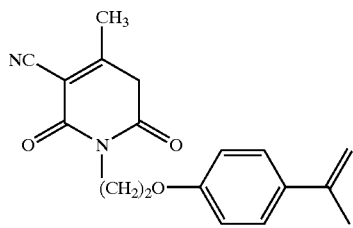
B-15
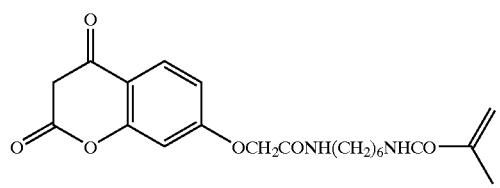
B-16
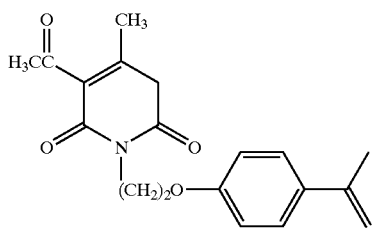
B-17
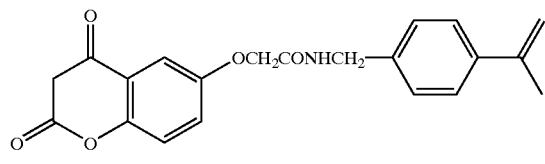
B-18
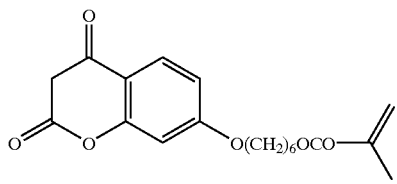
B-19
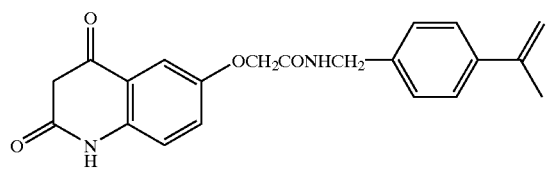
B-20
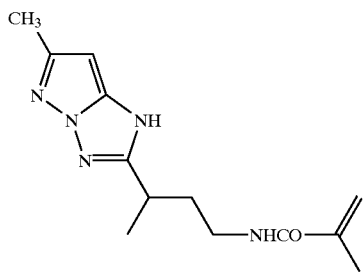
B-21
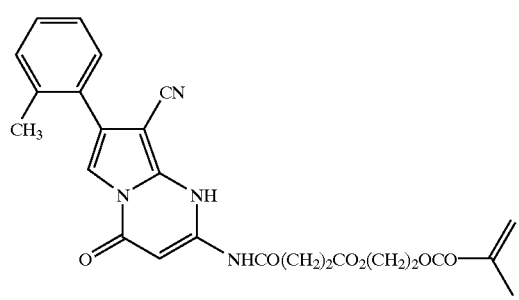
B-22
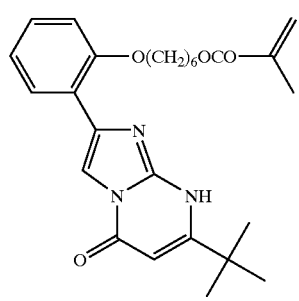

-continued
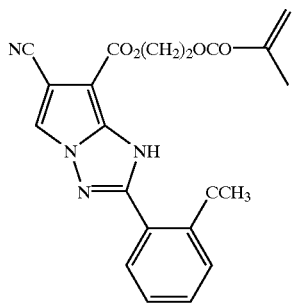
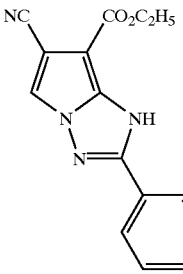
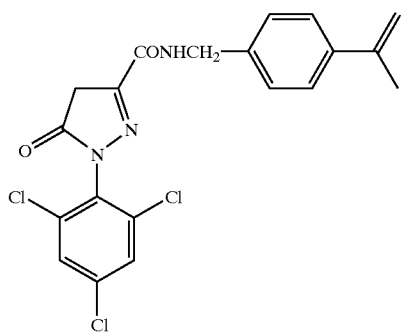
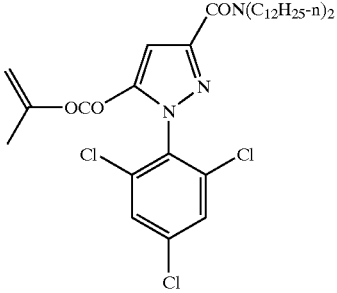
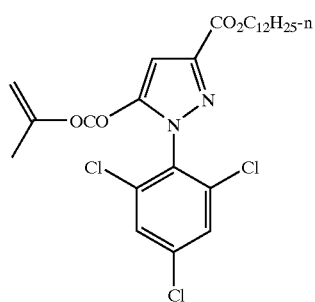
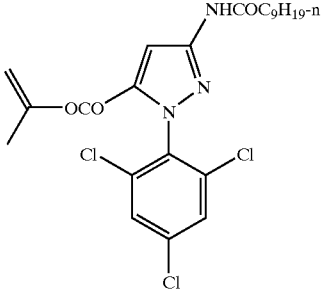
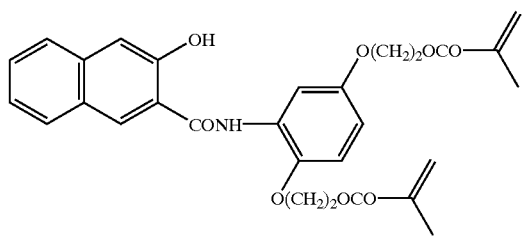
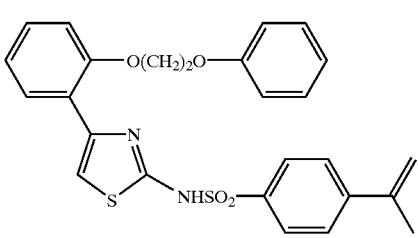
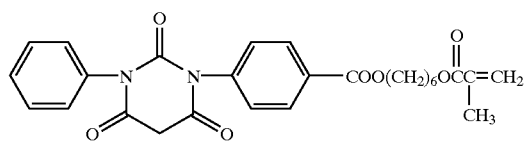
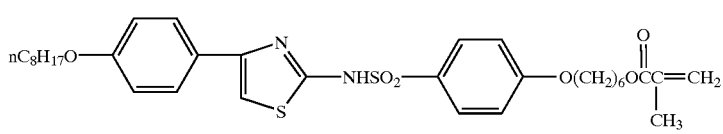

B-33

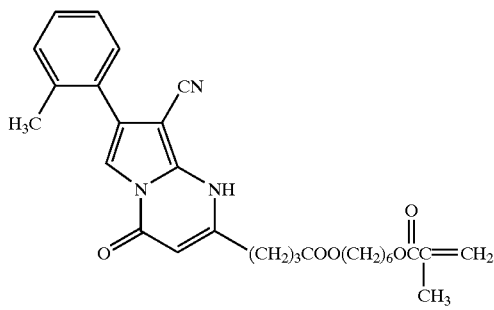

In the case where a diazonium salt compound coexists as a color-developing component, the coupler compound having a polymerizable group may be used in combination therewith, whereby a desired latent image may be formed by irradiation and an image may be formed by developing a color in accordance with the latent image.

In this case, the amount of the coupler compound having a polymerizable group is preferably 0.5 to 20 parts by mass, and more preferably 1 to 10 parts by mass, per part by mass of the diazonium salt compound.

When the amount is less than 0.5 parts by mass, the density of the produced color is often insufficient. The amount of more than 20 parts by mass often results in reduction in the sensitivity, or degradation in coatability.

Recording Material

The recording material of the invention will be described in detail below.

The recording material of the invention has a support and a light and heat sensitive recording layer. The recording material may have only one recording layer or a plurality of recording layers.

In the invention, the light and heat sensitive recording layer includes a color-developing component encapsulated in heat-responsive microcapsules, and a photopolymerizable composition disposed on the exterior of the heat-responsive microcapsules. The photopolymerizable composition contains at least a substantially colorless polymerizable compound having an ethylenic unsaturated group and a moiety that reacts with the color-developing component to form a color; an organic borate that is represented by the following formula (1) and has a melting point of no more than 100° C.; and a cationic compound that interacts with the organic borate.

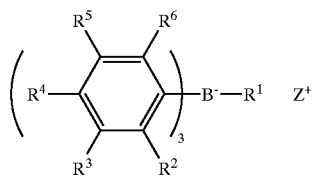

Formula (1)

In formula (1), $R^1$ represents an alkyl group, $R^2$ represents an electron-donating group, $R^3$ to $R^6$ each represent a hydrogen atom or a substituent, the sum of Hammett's substituent constants σ of $R^2$ to $R^6$ is 0 to 1, and $Z^+$ represents a group that can form a cation.

The organic borate, which is represented by formula (1) and has a melting point of no more than 100° C., may be the same as that contained in the photopolymerizable composition of the invention.

When the recording material is exposed in a desired image form, the substantially colorless polymerizable compound contained in the photopolymerizable composition on the exterior of the microcapsules is polymerized and hardened by a radical generated from the coexisting organic borate, to form a latent image in a desired shape.

Then, the recording material is heated, whereby the polymerizable compound in the unexposed portion moves in the recording material and reacts with the color-developing component enclosed in the microcapsules, to form a color.

Thus, the recording material is a positive type recording material, where the exposed portion is not colored and the unhardened portion, the unexposed portion, is colored to form an image.

The recording material may be a multicolor, multi-layered recording material having the light and heat sensitive recording layer composed of a plurality of recording layers layered on the support. In the multicolor, multi-layered recording material, a plurality of unicolor recording layers, which each contain microcapsules enclosing a different color-developing component, are layered. The multicolor, multi-layered recording material may be irradiated by a plurality of light sources having a different wavelength, to form a multicolor image.

Structure of the recording material of the invention may be the same as the recording material described in JP-A No. 3-87827.

Thus, the recording material of the invention may be a positive type recording material coated with a light and heat sensitive recording layer, which includes an electron-donating colorless dye encapsulated in microcapsules, and a photocurable composition disposed on the exterior of the microcapsules. The photocurable composition contains a photoinitiator and a compound with an electron-accepting group and a polymerizable group.

In the positive type recording material, the photocurable composition disposed on the exterior of the microcapsules is subjected to polymerization and hardened by exposure, to form a latent image. Then, by heating, the compound with the electron-accepting group and the polymerizable group in the unexposed portion moves and reacts with the electron-donating colorless dye contained in the microcapsules, to form a color. Thus, only the unhardened portion, the unexposed portion, is colored, whereby the positive type recording material forms a positive image high in contrast and clearness.

An image-recording method using the recording material of the invention includes the steps of: an exposure process where the photopolymerizable composition forms a latent image by imagewise exposure; a color-developing process where the color-developing component develops a color by heating in accordance with the latent image, to form an image; and a fixing process where the image is fixed and the photoinitiator component is decolored by irradiating a surface of the light and heat sensitive recording layer.

In the exposure process, the photopolymerizable composition in the recording layer is exposed in accordance with a desired image pattern, to form the latent image.

Then, in the color-developing process, the light and heat sensitive recording layer is heated, whereby the color-developing component and the compound which develops the color on reaction with the color-developing component or a specific moiety in the compound which develops the color react each other and develops the color in shape of the latent image, to form the image.

A light source for forming the latent image in the exposure process may be appropriately selected from known light sources with a wavelength within an ultraviolet to infrared region, in the case where a light absorption material such as a spectral sensitization compound, which absorbs a light in a particular region, is used in the recording layer. The light source preferably has a maximum absorption wavelength of 300 to 1,000 nm. Laser light sources of blue, green, and red and LED are preferable as the light source from the viewpoints of simplification and miniaturization of apparatus and reduction in costs.

In this case, the light source preferably has a wavelength suitable for the absorption wavelength of the cationic compound such as the spectral sensitization compound, which interacts with the organic borate. The cationic compound may be selected suitably for the light source wavelength, whereby a blue to red light source, and a compact inexpensive infrared laser can be used in the exposure process, and the recording material can have expanded application and increased sensitivity and sharpness.

In the image-recording method using the recording material of the invention, the fixing process is carried out after the color-developing process. In the fixing process, the surface of the light and heat sensitive recording layer is further irradiated by a particular light source, thereby fixing the image formed in the color-developing process and removing a color provided by the cationic compound component which remains in the recording layer and which interacts with the organic borate.

The non-image portion (or background portion) can be increased in whiteness to obtain a chemically stable final image by the fixing process. In the case of using the diazonium salt compound in the recording material, the diazonium salt compound remaining in the recording layer after the image formation can be deactivated by the irradiation. Thus, the fixing process is effective for stabilizing the image during storage without changes in the density, and color.

Preferred examples of the light source for use in the fixing process include various light sources such as a mercury-vapor lamp, an ultrahigh pressure mercury lamp, an electrodeless discharge-type mercury lamp, a xenon lamp, a tungsten lamp, a metal halide lamp and a fluorescent lamp.

The light source having a wavelength corresponding to the absorption wavelength of the cationic compound contained in the light and heat sensitive recording layer is preferably selected and used.

There are no particular restrictions as to a method for the irradiation in the fixing process. The method may be such that the entire surface of the light and heat sensitive recording layer is irradiated at once, or such that the recording surface is gradually irradiated by scanning and the entire surface is irradiated finally. Any method may be used as long as the entire recording surface of the recording material can be irradiated by a substantially uniform light after the image formation ultimately. Thus, it is preferable that the entire recording surface is irradiated from the viewpoint of enhancing the effects of the invention.

The irradiation time in the fixing process using the light source maybe selected such that the formed image is fixed and the non-image portion (or the background portion) is sufficiently decolored. The irradiation time is preferably several seconds to several tens minutes, more preferably several seconds to several minutes, from the viewpoint of obtaining sufficient image fixability and decolorizability.

The basic structure of the recording material of the invention may be such as mentioned above. The components of the recording material will be described in detail below.

The recording material contains, as color-forming components, the color-developing component encapsulated in the microcapsules, and the substantially colorless compound that reacts with the color-developing component and makes the color-developing component develop a color.

Preferred examples of the combination of the two color-forming components (the color-developing component and the substantially colorless compound) include the following combinations of (a) to (r) In the combinations of (a) to (r) the former is the color-developing component and the latter is the substantially colorless compound.

(a) Combinations of an electron-donating dye precursor and an electron-accepting compound.

(b) Combinations of a diazonium salt compound and a coupling component (hereinafter referred to as "coupler").

(c) Combinations of an organic acid metal salt such as silver behenate and silver stearate, and a reducing agent such as protocatechinic acid, spiroindane and hydroquinone.

(d) Combinations of a long chain fatty acid iron salt such as ferric stearate and ferric myristate, and a phenol compound such as tannic acid, gallic acid and ammonium salicylate.

(e) Combinations of an organic acid heavy metal salt such as a nickel, cobalt, lead, copper, iron, mercury or silver salt of acetic acid, stearic acid or palmitic acid, and an alkaline metal sulfide or an alkaline earth metal sulfide such as calcium sulfide, strontium sulfide and potassium sulfide, and combinations of the organic acid heavy metal salt and an organic chelating agent such as s-diphenylcarbazide and diphenylcarbazone.

(f) Combinations of a heavy metal sulfate such as silver sulfate, lead sulfate, mercury sulfate and sodium sulfate, and a sulfur compound such as sodium tetrathionate, sodium thiosulfate and thiourea.

(g) Combinations of an aliphatic ferric salt such as ferric stearate, and an aromatic polyhydroxy compound such as 3,4-hydroxytetraphenylmethane.

(h) Combinations of an organic acid metal salt such as silver oxalate and mercury oxalate, and an organic polyhydroxy compound such as polyhydroxyalcohol, glycerin and glycol.

(i) Combinations of a fatty acid ferric salt such as ferric pelargonate and ferric laurate, and a thiocecylcarbamide or isothiocecylcarbamide derivative.

(j) Combinations of an organic acid lead salt such as lead caproate, lead pelargonate and lead behenate, and a thiourea derivative such as ethylenethiourea and N-dodecylthiourea.

(k) Combinations of a higher fatty acid heavy metal salt such as ferric stearate and copper stearate, and zinc dialkyldithiocarbamate.

(l) Combinations that form an oxazine dye, such as combinations of resorcin and a nitroso compound.
(m) Combinations of a formazane compound, and a reducing agent and/or a metal salt.
(n) Combinations of a protected dye precursor or a leuco dye precursor, and a deprotecting agent.
(o) Combinations of an oxidation type coloring agent and an oxidizing agent.
(p) Combinations that generate a phthalocyanine, such as combinations of a phthalonitrile compound and a diiminoisoindoline compound.
(q) Combinations that generate a color pigment, such as combinations of an isocyanate compound and a diiminoisoindoline compound.
(r) Combinations that generate a pigment, such as combinations of a pigment precursor, and an acid or base.

The color-developing component encapsulated in the microcapsules is preferably the substantially colorless, electron-donating colorless dye or the diazonium salt compound.

The electron-donating colorless dye may be a known one as long as it can reacts with the substantially colorless polymerizable compound which has an ethylenic unsaturated group and a moity that reacts with a color-developing component to develop color.

Specific examples of the electron-donating colorless dye include phthalide compounds, fluorane compounds, phenothiazine compounds, indolylphthalide compounds, leucoauramine compounds, rhodaminelactam compounds, triphenylmethane compounds, triazene compounds, spiropyran compounds, pyridine compounds, pyrazine compounds and fluorene compounds, described in JP-A No. 2000-199952.

In the invention, the color-developing component is not limited to the specific examples.

The electron-donating colorless dye may be used alone, and a plurality of the electron-donating colorless dyes may be used in combination for a purpose of color control.

In the case of using the recording material of the invention as a full color recording material, electron-donating colorless dyes for developing each of cyan, magenta and yellow are used.

The cyan, magenta and yellow color-developing dyes may be dyes described in U.S. Pat. No. 4,800,149.

Further, dyes described in U.S. Pat. No. 4,800,148 may be used as the electron-donating colorless dye for yellow color development, and dyes described in JP-A No. 63-53542 may be used as the electron-donating colorless dye for cyan color development.

The amount of the electron-donating colorless dye in the light and heat sensitive recording layer is preferably 0.01 to 3 $g/m^2$, and more preferably 0.1 to 1 $g/m^2$.

When the amount is less than 0.01 $g/m^2$, sufficient color density cannot be obtained. The amount of more than 3 $g/m^2$ deteriorates the coatability.

Examples of the diazonium salt compound include compounds described in JP-A No. 2000-199952.

The maximum absorption wavelength λmax of the diazonium salt compound for use in the invention is preferably 450 nm or less, and more preferably 290 to 440 nm from the viewpoint of the effect.

The diazonium salt compound may be used alone, and a plurality of the diazonium salt compounds may be used in combination for a purpose of color control.

The amount of the diazonium salt compound in the light and heat sensitive recording layer is preferably 0.01 to 3 $g/m^2$, and more preferably 0.02 to 1.0 $g/m^2$.

When the amount is less than 0.01 $g/m^2$, the color development is often insufficient. When the amount is more than 3 $g/m^2$, the sensitivity is reduced or a longer fixing time is required in some cases.

The recording material of the invention contains the photopolymerizable composition containing the polymerizable compound with the ethylenic unsaturated group, the organic borate and the cationic compound that interacts with the organic borate, in addition to the color-developing component.

The photopolymerizable composition used in the recording material may be the above-mentioned photopolymerizable composition of the invention. In the recording material of the invention, the substantially colorless polymerizable compound, which has the ethylenic unsaturated group and a moiety that reacts with the color-developing component to form a color, is used as the polymerizable compound having the ethylenic unsaturated group.

The substantially colorless polymerizable compound which has an ethylenic unsaturated group and a moity that reacts with a color-developing component to develop color may be an electron-accepting compound or a coupler compound with a polymerizable group which can be used in the photopolymerizable composition.

The organic borate used in the recording material is the same as the above-mentioned organic borate used in the photopolymerizable composition of the invention, which is represented by formula (1) and has the melting point of no more than 100° C.

The cationic compound, which interacts with the organic borate in the recording material, is the same as the above-mentioned cationic compound for the photopolymerizable composition of the invention.

In the recording material of the invention, the amount of the photopolymerizable composition per part by mass of the color-developing component is preferably 5 to 20 parts by mass, and more preferably 8 to 15 parts by mass.

When the amount is less than 5 parts by mass, the density of the produced color is often insufficient. When the amount is more than 20 parts by mass, the polymerization sensitivity and the photo-decolorizability are often insufficient.

In the light and heat sensitive recording layer of the recording material, the composition ratio of the photopolymerizable composition is preferably the same as that of the above-mentioned photopolymerizable composition of the invention.

The recording material of the invention may be a unicolor recording material where one light and heat sensitive recording layer is disposed on the support, or a multicolor recording material where a plurality of unicolor recording layers to each produce a different color are layered on the support.

A protective layer may be disposed as an outermost layer on the light and heat sensitive recording layer, if necessary.

The protective layer may have a single layer structure or a multi-layered structure.

The protective layer may be made of a water-soluble polymer compound such as gelatin, polyvinyl alcohol, carboxy-modified polyvinyl alcohol, a vinyl acetate-acrylamide copolymer, silicon-modified polyvinyl alcohol, starch, modified starch, methylcellulose, carboxymethylcellulose, hydroxymethylcellulose, a gelatin derivative, gum arabic, casein, a styrene-maleic acid copolymer hydrolysate, a styrene-maleic acid copolymer half ester hydrolysate, an isobutylene-maleic anhydride copolymer hydrolysate, a polyacrylamide derivative, polyvinylpyrolidone, sodium polystyrene sulfonate and sodium alginate; and a latex such as a styrene-butadiene rubber latex, an acrylonitrile-butadiene rubber latex, a methyl acrylate-butadiene rubber latex and a vinyl acetate emulsion.

The storage stability of the recording material may be further increased by cross-linking the water-soluble polymer compound for the protective layer.

A cross-linking agent for cross-linking the water-soluble polymer compound may be a known one, and specific examples thereof include water-soluble initial condensates such as N-methylolurea, N-methylolmelamine and urea-formalin; dialdehyde compounds such as glyoxal and glutaraldehyde; and inorganic cross-linking agents such as boric acid and borax; polyamide epichlorohydrine.

Further, known pigment, metal soap, wax, surfactant, and/or fluorescent whitening agent may be used in the protective layer. Known ultraviolet-absorbing agent or ultraviolet-absorbing agent precursor, such as a hydroxyphenylbenzotriazole agent, a hydroxybenzophenone agent and a hydroxyphenyltriazine agent, may be added to the protective layer.

The application amount of the protective layer is preferably 0.2 to 5 g/m$^2$, and more preferably 0.5 to 3 g/m$^2$.

The multicolor, multi-layered recording material has a plurality of the unicolor recording layers layered on the support, and each recording layer contains the photopolymerizable composition and the microcapsules enclosing the color-developing component. The color-developing components in each recording layer develop a different color, and the photopolymerizable compositions in each recording layer are sensitive to light with a different wavelength. The photopolymerizable compositions may use the spectral sensitization compound with a different absorption wavelength, to be each sensitive to light with a different wavelength. In this case, an intermediate layers maybe formed between the unicolor recording layers.

The light and heat sensitive recording layer of the multicolor, multi-layered recording material according to the invention may be provided, for example, as follows.

A 1st recording layer, which includes microcapsules containing a yellow color-developing component and a photopolymerizable composition sensitive to light with a center wavelength $\lambda_1$ emitted from a light source, is formed on a support. On the 1st recording layer, a 2nd recording layer, which includes microcapsules containing a magenta color-developing component and a photopolymerizable composition sensitive to light with a center wavelength $\lambda_2$ is provided. Further, on the 2nd recording layer, a 3rd recording layer, which comprises microcapsules containing a cyan color-developing component and a photopolymerizable composition sensitive to light with a center wavelength $\lambda_3$ is provided to provide the light and heat sensitive recording layer A. An intermediate layer may be disposed between the recording layers of the light and heat sensitive recording layer A, if necessary, to provide a light and heat sensitive recording layer B.

In the case of forming an image by the multicolor recording material, the material may be exposed by a plurality of light sources corresponding to the absorption wavelength of each recording layer in the exposure process. As a result, each recording layer forms a latent image selectively depending on the absorption wavelength, to form a multicolor image with high sensitivity and sharpness. The background portion colored by a photoinitiator such as the spectral sensitization compound remaining in the recording layer may be decolored by irradiating the recording layer surface, and thus, an image can be formed with high contrast and quality.

In the recording material of the invention, the color-developing component such as the electron-donating colorless dye and the diazonium salt compound is encapsulated in the microcapsules. The microencapsulation method may be selected from known ones.

Examples of the microencapsulation method include methods using coacervation of a hydrophilic wall-forming material, described in U.S. Pat. Nos. 2,800,457 and 2,800,458; interfacial polymerization methods described in U.S. Pat. No. 3,287,154, British Patent No. 990,443, JP-B Nos. 38-19574, 42-446 and 42-771; methods using polymer precipitation, described in U.S. Pat. Nos. 3,418,250 and 3,660,304; methods using an isocyanate polyol wall material, described in U.S. Pat. No. 3,796,669; methods using an isocyanate wall material, described in U.S. Pat. No. 3,914,511; methods using an urea-formaldehyde wall-forming material or an urea-formaldehyde-resorcinol wall-forming material, described in U.S. Pat. Nos. 4,001,140, 4,087,376 and 4,089,802; methods using a wall-forming material such as a melamine-formaldehyde resin and a hydroxypropylcellulose, described in U.S. Pat. No. 4,025,455; in situ methods using monomer polymerization, described in JP-B No. 36-9168 and JP-A No. 51-9079; electrolytic dispersion cooling methods described in British Patent Nos. 952,807 and 965,074; spray drying methods described in U.S. Pat. No. 3,111,407 and British Patent No. 930,422; and methods described in JP-B No. 7-73069, and JP-A Nos. 4-101885 and 9-263057.

The microencapsulation method is not limited to the above-mentioned methods, particularly preferably an interfacial polymerization method in the recording material of the invention. In the interfacial polymerization method, the color-developing component is dissolved or dispersed in a hydrophobic organic solvent to prepare an oil phase for a core of the microcapsules, the oil phase is mixed with an aqueous phase in which a water-soluble polymer is dissolved, and the resulting mixture is emulsified and dispersed by a homogenizer. The mixture is heated to cause a polymer-forming reaction at interfaces between the oil phase and the aqueous phase and to provide microcapsule walls of a polymer.

In the interfacial polymerization method, microcapsules having a uniform particle diameter can be rapidly prepared, and whereby the recording material having excellent storage stability can be produced.

The microcapsules used in the invention is preferably such that the microcapsule wall acts to isolate a component in the microcapsules from a component on the exterior of the microcapsules and inhibits contact of the components at an ordinary temperature, and the components can be in contact with each other when the microcapsules are heated at a temperature. Such function of the microcapsules can be freely controlled by appropriately selecting a microcapsule wall material, a microcapsule core material (component enclosed in the microcapsules), and an additive.

The microcapsule wall material is added inside and/or outside of the oil droplets.

Examples of the microcapsule wall material include polyurethane, polyurea, polyamide, polyester, polycarbonate, urea-formaldehyde resins, melamine resins, polystyrene, styrene-methacrylate copolymers, and styrene-acrylate copolymers. Among them, preferred are polyurethane, polyurea, polyamide, polyester and polycarbonate, and more preferred are polyurethane and polyurea.

The polymers for the microcapsule wall may be used in combination of two or more.

Examples of the water-soluble polymer include gelatin, polyvinylpyrrolidone, and polyvinyl alcohol.

For example, in the case of using polyurethane as the microcapsule wall material, the microcapsule wall maybe formed as follows. A polyvalent isocyanate and a second material such as polyol and polyamine, which reacts with the polyvalent isocyanate to form the microcapsule wall, are added into a water-soluble polymer aqueous solution (aqueous phase) or an oil medium to be encapsulated (oil phase). Then, the resulting mixture is emulsified and dispersed in water, and the polymer-forming reaction is caused at the interfaces between the aqueous phase and the oil phase by heating, to form the microcapsule wall.

The polyvalent isocyanate and polyol or polyamine to react therewith may be compounds described in U.S. Pat. Nos. 3,281,383, 3,773,695 and 3,793,268, JP-B Nos. 48-40347 and 49-24159, and JP-A Nos. 48-80191 and 48-84086.

In forming the microcapsules containing the color-developing component of this invention, the color-developing component may be in a liquid or solid state.

In the case where the color-developing component is encapsulated in the liquid state, the color-developing component of the electron-donating colorless dye or the diazonium salt compound may be dissolved in an organic solvent and microencapsulated.

The organic solvent may be generally selected from high boiling point solvents and examples thereof include phosphate, phthalic acid ester, acrylic ester, methacrylic ester, other carboxylic acid ester, fatty acid amide, alkylated biphenyl, alkylated terphenyl, chlorinated paraffin, alkylated naphthalene, diallylethane, compounds solid at an ordinary temperature, oligomer oils, and polymer oils.

Specifically, organic solvents described in JP-A Nos. 59-178451 to 59-178455, 59-178457, 60-242094, 63-85633, 6-194825, 7-13310 to 7-13311, and 9-106039, and Japanese Patent No. 1988625 may be used in the invention.

Further, no organic solvent may be used for microencapsulation to prepare so-called oil-less microcapsules.

The amount of the organic solvent preferably 1 to 500 parts by mass per 100 parts by mass of the electron-donating colorless dye or the diazonium salt compound.

In the case where the electron-donating colorless dye or the diazonium salt compound to be encapsulated has a low solubility in the organic solvent, a low boiling point solvent in which the electron-donating colorless dye or the diazonium salt compound has a high solubility may be used as an assistant solvent. The low boiling point solvent may be used without the organic solvent.

Examples of the low boiling point solvent include ethyl acetate, propyl acetate, isopropyl acetate, butyl acetate, and methylene chloride.

An aqueous solution in which the water-soluble polymer is dissolved may be used as the aqueous phase for emulsifying and dispersing the oil phase.

After adding the oil phase into the aqueous phase, the mixture is emulsified and dispersed by a homogenizer. The water-soluble polymer acts as a protective colloid that enables uniform and easy dispersion, and as a dispersion medium that stabilizes the emulsified and dispersed aqueous solution.

A surfactant may be added to at least one of the oil phase and the aqueous phase, to achieve more uniform emulsification dispersion and more stable dispersion liquid.

The water-soluble polymer used as the protective colloid may be appropriately selected from known anionic polymers, nonionic polymers and amphoteric polymers.

The anionic polymer may be a natural or synthetic polymer, and for example, a polymer having a linking group such as —COO— and —$SO^{2-}$—.

Specific examples of the anionic polymer include natural polymers such as gum arabic, alginic acid and pectin; semisynthetic polymers such as carboxymethylcellulose, gelatin derivatives such as gelatin phthalate, starch sulfate, cellulose sulfate, and lignin sulfonic acid; and synthetic polymers such as maleic anhydride copolymers and hydrolysates thereof, acrylic or methacrylic acid polymers and copolymers, vinylbenzenesulfonic acid polymers and copolymers, and carboxy-modified polyvinyl alcohols.

Examples of the nonionic polymer include polyvinyl alcohol, hydroxyethyl cellulose, and methylcellulose.

The amphoteric polymer may be gelatin. Among these, gelatin, a gelatin derivative or polyvinyl alcohol is preferable.

The water-soluble polymer is used as a 0.01 to 10 mass % aqueous solution.

The surfactant may be a known emulsification surfactant. For example, the surfactant may be appropriately selected from anionic or nonionic surfactants that interact with the protective colloid without precipitation or aggregation.

Specific examples of the surfactant include sodium alkylbenzenesulfonate, sodium alkylsulfate, a sodium salt of dioctyl sulfosuccinate, and polyalkylene glycol such as polyoxyethylenenonyl phenyl ether.

The amount of the surfactant is preferably 0.1 to 5%, and more preferably 0.5 to 2%, based on the amount of the oil phase by weight.

Components such as the color-developing component may be solid-dispersed with the water-soluble polymer, the spectrally sensitizing dye, and another color-forming aid by a sand mill. It is preferable that the components are dissolved in a high boiling point organic solvent having poor or no water-solubility, the resulting liquid is mixed with a polymer aqueous solution (aqueous phase) containing the surfactant and/or the water-soluble polymer as the protective colloid, and the mixture is emulsified by a homogenizer to obtain an emulsification dispersion product. In this case, a low boiling point solvent may be used as a dissolving aid, if necessary.

Further, components including the color-developing component may be emulsified and dispersed separately, and may be mixed together, dissolved in the high boiling point solvent and/or the low boiling point solvent, and emulsified and dispersed.

The diameter of the particles formed by emulsification dispersion is preferably 1 μm or less.

The emulsification dispersion of the oil phase containing the components and the aqueous phase containing the surfactant and/or the protective colloid may be easily carried out by means for emulsifying fine particles such as high speed stirring, and ultrasonic dispersing, for example, by a known emulsifying apparatus such as a homogenizer, a Manton Gaulin, an ultrasonic disperser, a dissolver and a Kady mill.

After the emulsification, the emulsion is heated to 30 to 70° C. to promote the microcapsule wall-forming reaction. To prevent the aggregation of the microcapsules, collision probability of the microcapsules may be reduced by adding water and or thoroughly stirring the emulsion during the reaction.

A dispersion for preventing the aggregation may be added during the reaction.

Carbon dioxide gas is generated as the polymerization proceeds. When the generation of the carbon dioxide gas has been finished, the microcapsule wall-forming reaction may be considered to be finished.

Generally, the reaction is carried out for a several hours to prepare the microcapsules enclosing the color-developing component.

The average particle diameter of the microcapsules is preferably 20 μm or less, and, from the viewpoint of high resolution, more preferably 5 μm or less.

When the diameter of the microcapsules is too small, the surface area is too large based on a fixed solid content and a large amount of the wall material is needed. Thus, the average particle diameter is preferably 0.1 μm or more.

In the case of using the recording material of the invention as the multicolor recording material, the light and heat sensitive recording layer of the recording material is formed by laminating a plurality of unicolor recording layers on the support. Each of the unicolor recording layers includes the microcapsules that contain the electron-donating colorless dye or the diazonium salt compound to develop a different color, and the photopolymerizable composition that contains the cationic compound having a different maximum absorption wavelength. Each recording layer is sensitized by the light source with a different wavelength when light is irradiated, and whereby the entire light and heat sensitive recording layer forms a multicolor image.

An intermediate layer may be provided between the unicolor recording layers in the light and heat sensitive recording layer. The intermediate layer contains a binder as a main component, and may contain an additive such as a hardening agent, a polymer latex, a filter dye, mica and an ultraviolet-absorbing agent, if necessary.

The filter dye may be selected from the spectral sensitization compounds. The filter dye preferably has an absorption wavelength equal to that of the spectral sensitization compound, which is contained in the recording layer disposed on the intermediate layer containing the filter dye, from the viewpoint of high sharpness of the image.

The filter dye may be emulsified and dispersed by an oil-in-water dispersion method or a polymer dispersion method, to be added to a desired layer, particularly the intermediate layer.

In the oil-in-water dispersion method, the filter dye is dissolved in a high boiling point solvent having a boiling point of 175° C. or more or a low boiling point solvent having a boiling point of 30 to 160° C. or a mixture thereof, and the resultant is fine-dispersed in an aqueous solution such as water, a gelatin aqueous solution and a polyvinyl alcohol aqueous solution, under the presence of a surfactant.

The high boiling point solvent may be a solvent described in U.S. Pat. No. 2,322,027. The high boiling point solvent and the low boiling point solvent may be the same as the solvents used in the above-mentioned preparation of the microcapsules.

Examples of processes in the polymer dispersion method and latex for hardening and impregnation are described in U.S. Pat. No. 4,199,383, GP Application (OLS) Nos. 2,541,274 and 2,541,230, JP-A Nos. 49-74538, 51-59943 and 54-32552, and Research Disclosure, Vol. 148, Item 14850, August 1976.

Preferred are acrylic esters and methacrylic esters such as ethyl acrylate, n-butyl acrylate, n-butyl methacrylate and 2-acetoacetoxyethyl methacrylate; acrylic acid; and copolymer latexes of acid monomers such as 2-acrylamide-2-methylpropane sulfonic acid.

Examples of the binder for use in the protective layer, the light and heat sensitive recording layer, and the intermediate layer in the recording material of the invention include the binders used for emulsification dispersion of the photopolymerizable composition; the water-soluble polymers used for encapsulating the color-developing component; solvent-soluble polymers such as polystyrene, polyvinyl formal, polyvinyl butyral, acrylic resins such as polymethyl acrylate, polybutyl acrylate, polymethyl methacrylate, polybutyl methacrylate and copolymers thereof, phenol resins, styrene-butadiene resins, ethyl cellulose, epoxy resins and urethane resins; and polymer latexes derived therefrom.

Among them, gelatin and polyvinyl alcohol are preferable.

Any surfactant may be used for each recording layer of the recording material of the invention, for a purpose of application assistance, static prevention, lubricity improvement, emulsification dispersion, or adhesion prevention.

Examples of the surfactant include nonionic surfactants such as saponin, polyethylene oxide and polyethylene oxide derivatives such as alkyl ether of polyethylene oxide; anionic surfactants such as alkyl sulfonate, alkylbenzene sulfonate, alkylnaphthalene sulfonate, alkyl sulfate, N-acyl-N-alkyltaurine, sulfosuccinate ester and sulfoalkylpolyoxyethylenealkyl phenyl ether; amphoteric surfactants such as alkylbetaine and alkylsulfobetaine; and cationic surfactants such as aliphatic or aromatic quaternary ammonium salts.

Further, an additive such as a dye, an ultraviolet-absorbing agent, a plasticizing agent, a fluorescent whitening agent, a matting agent, a application assistant, a hardening agent, an antistatic agent and a slipping property-improving agent may be used, if necessary.

Specific examples of the additive are described in *Research Disclosure*, Vol. 176, Item 17643, December 1978 and *Research Disclosure*, Vol. 187, Item 18716, November 1979.

In the recording material of the invention, a hardening agent is preferably used in the light and heat sensitive recording layer, the intermediate layer, and/or the protective layer. It is particularly preferable that the hardening agent is used in the protective layer to decrease the viscosity of the protective layer.

Gelatin hardening agents for a photographic material are useful as the hardening agent. Examples of the hardening agent include aldehyde compounds such as formaldehyde and glutaraldehyde; reactive halogen compounds described in U.S. Pat. No. 3,635,718; compounds having a reactive ethylenic unsaturated group described in U.S. Pat. No. 3,635,718; aziridine compounds described in U.S. Pat. No. 3,017,280; epoxy compounds described in U.S. Pat. No. 3,091,537; halogenocarboxyaldehyde compounds such as mucochloric acid; dioxane compounds such as dihydroxydioxane and dichlorodioxane; vinylsulfone compounds described in U.S. Pat. Nos. 3,642,486 and 3,687,707; vinylsulfone precursors described in U.S. Pat. No. 3,841,872; ketovinyl compounds described in U.S. Pat. No. 3,640,720; and inorganic hardening agents such as chrome alum, zirconium sulfate and boric acid.

Among them, preferred are 1,3,5-triacryloyl-hexahydro-s-triazine, 1,2-bisvinylsulfonylmethane, 1,3-bis(vinylsulfonylmethyl)propanol-2, bis(α-vinylsulfonylacetoamide)ethane, a 2,4-dichloro-6-hydroxy-s-triazine sodium salt, 2,4,6-triethyleneimino-s-triazine, and boric acid.

The amount of the hardening agent is preferably 0.5 to 5 mass % based on the binder.

The recording material of the invention may be produced by the steps of: dissolving each component in a solvent if necessary to prepare coating liquids for the light and heat sensitive recording layer, and the protective layer; applying the coating liquids onto the support; and drying the coating layers.

Examples of the solvent include water; alcohol solvents such as methanol, ethanol, n-propanol, isopropanol, n-butanol, sec-butanol, methyl cellosolve and 1-methoxy-2-propanol; halogen solvents such as methylene chloride and ethylene chloride; ketone solvents such as acetone, cyclohexanone and methyl ethyl ketone; ester solvents such as methyl acetate cellosolve, ethyl acetate and methyl acetate; toluene; xylene; and mixtures thereof. Among them, particularly preferable is water.

The coating liquid for the light and heat sensitive recording layer may be applied to the support by a blade coater, a rod coater, a knife coater, a roll doctor coater, a reverse roll coater, a transfer roll coater, a gravure coater, a kiss roll coater, a curtain coater, and an extrusion coater.

The coating liquid may be applied with reference to *Research Disclosure*, Vol. 200, Item 20036 XV, December 1980.

The thickness of the light and heat sensitive recording layer is preferably 0.1 to 50 $\mu$m, and more preferably 5 to 35 $\mu$m.

The recording material of the invention produced in the above-mentioned manner can be used for various purposes such as a copia, a facsimile, a color printer, a label, a color proof, and a mother print.

Examples of the support used for the recording material of the invention include synthetic papers such as neutral papers, acidic papers, coated papers and layered papers; films such as polyethylene terephthalate films, cellulose triacetate films, polyethylene films, polystyrene films and polycarbonate films; and metal plates of aluminum, and zinc, copper. A surface of the support may be subjected to various treatments such as surface processing, undercoating and metal deposition.

Supports described in *Research Disclosure*, Vol. 200, Item 20036 XVII, December 1980 may be used in the invention.

The support may contain a fluorescent whitening agent, a bluing dye, and/or a pigment.

Further, an anti-halation layer may be provided between the support and the light and heat sensitive recording layer, or on the light and heat sensitive recording layer side surface of the support, if necessary. A sliding layer, an antistatic layer, a curl-preventing layer, and/or an adhesive layer may be provided on the opposite surface of the support.

An adhesion layer may be provided between the support and the light and heat sensitive recording layer, whereby the recording material may be an adhesive sheet using the support as a separate paper.

An anti-halation layer, which can be bleached by irradiation or heating, may be provided between the support and the light and heat sensitive recording layer. This anti-halation layer may be provided on a surface of a transparent support, which is opposite of the light and heat sensitive recording layer side surface.

For example, a combination of an organic borate and a cationic compound to interact with the organic borate may be used in the anti-halation layer that is bleached by irradiation. The anti-halation layer, which is bleached by heating, may be such that a base or a nucleophile is generated by heating to bleach a coexisting spectrally sensitizing dye.

A layer, which is composed of a polymer low in oxygen permeability such as gelatin and polyvinyl alcohol (PVA), may be provided between the support and the light and heat sensitive recording layer. The layer effectively prevents discoloration due to photo-oxidation of the formed image.

The recording material of the invention may be subjected to heat development processing during or after the exposure for forming the latent image, to form a visible image.

In the heat development processing, the recording material may be heated by a known method, for example, by a heat roller.

In general, the heating temperature is preferably 80 to 200° C., and more preferably 85 to 130° C.

When the heating temperature is less than 80° C., the color density is often insufficient. When the heating temperature is 200° C. or more, the non-image portion (the background portion) may be colored or the support may be damaged.

The heating time is preferably 1 second to 5 minutes, and more preferably 3 seconds to 1 minute. In the case where the recording material of the invention is subjected to the heat development processing, the entire surface of the recording material may be uniformly preheated at a predetermined temperature less than the color-developing temperature, to further increase the sensitivity.

After the heat development processing, the light and heat sensitive recording layer is irradiated by light. Thus, the formed image is fixed, and a component such as the cationic compound that interacts with the organic borate and the diazonium salt compound, which remains in the recording layer and reduces the whiteness of the background portion, is decolored, decomposed or deactivated.

Accordingly, the component, which remains in the recording layer including the background portion (the non-image portion) and colors the background portion, can be removed. In the case of using the diazonium salt compound, the remaining diazonium salt compound may be deactivated to inhibit the color-developing reaction, and whereby the density change of the formed image is suppressed to significantly improve the storage stability of the image.

The recording material of the invention may be used not only for the above-described recording method but also for other known recording methods.

For example, the recording material of the invention may be used for heat recording using a heating apparatus such as a thermal head. Further, the recording material of the invention may be used for a recording method proposed by 3M Co. in WO95/31754, in which a light and heat sensitive silver halide recording material is irradiated by a laser beam to form an image such that the beam spots overlap in a predetermined range, thereby improving the contrast and the image quality.

Furthermore, the recording material of the invention may be used in a recording method proposed by Canon Inc. in JP-A No. 60-195568, in which a laser beam is irradiated onto a surface of a recording material with an inclined incident angle so that the reflection pitch of the incident beam reflecting on an interface of a photosensitive layer of the recording material is made larger than a beam spot diameter, to prevent optical interference in the recording material.

EXAMPLES

The present invention will be described below with reference to Examples without intention of restricting the scope of the present invention. Incidentally, "parts" and "%" in Examples represent "parts by mass" and "mass %", respectively.

<Preparation of Electron-Donating Colorless Dye-Enclosing Microcapsule Liquid>

(1-a) Preparation of Electron-Donating Colorless Dye-Enclosing Microcapsule Liquid (I)

8.4 g of the following electron-donating colorless dye (1) for magenta color development was dissolved in 18.4 g of ethyl acetate, and 14 g of a microcapsule wall material (Trade name: Takenate D-110N, available from Takeda Chemical Industries Co. Ltd.) and 0.35 g of a microcapsule wall material (Trade name: Millionate MR400, available from Nihon Polyurethane Kogyo K.K.) were added thereto.

The resulting solution was added to a mixture of 52 g of an 8% phthalated gelatin solution and 0.34 g of a 10% sodium dodecylbenzenesulfonate solution, and emulsified and dispersed at 40° C. to prepare an emulsion. Then, 44 g of water and 0.62 g of diethylene triamine were added to the obtained emulsion, and the resultant was heated to 65° C. while stirring. Thus, 3 hours after, an electron-donating colorless dye-enclosing microcapsules liquid (I) were prepared. The electron-donating colorless dye-enclosing microcapsule liquid (I) had a core of the following electron-donating colorless dye (1) and an average particle diameter of 0.5 μm.

Electron-donating colorless dye (1)

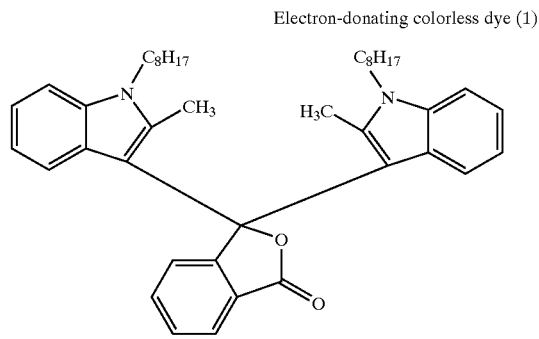

(1-b) Preparation of Electron-Donating Colorless Dye-Enclosing Microcapsule Liquid (II)

An electron-donating colorless dye-enclosing microcapsule liquid (II), which had a core of the following electron-donating colorless dye (2) and an average particle diameter of 0.5 μm, was prepared in the same manner as above-mentioned (1-a) except for using the electron-donating colorless dye (2) for cyan color development instead of the electron-donating colorless dye (1).

Electron-donating colorless dye (2)

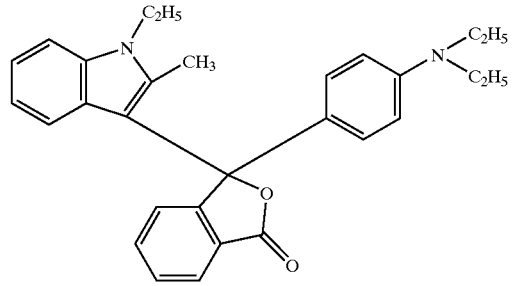

<Preparation of Photopolymerizable Composition Emulsion>

(2-a) Preparation of Photopolymerizable Composition Emulsion (1)

3 g of a mixture of the following electron-accepting compounds (1) and (2) having a polymerizable group and 0.012 g of the following thermal polymerization inhibitor (ALI) were dissolved at 72° C. in 4 g of isopropyl acetate having a water-solubility of approximately 4.3%. A mixing ratio of the electron-accepting compounds (1) and (2) was 1/1 by weight in the mixture. Then, 0.289 g of the following organic borate (1) having a melting point of less than 25° C., 0.04 g of the following spectrally sensitizing dye (1), and 0.03 g of the following sensitizing aid (1) were added to thus obtained mixed solution and dissolved at 42° C.

The resulting solution was added to 6 g of a 15% gelatin aqueous solution, 5 g of water, and 0.5 g of a 10% aqueous solution of the following surfactant (1), and emulsified by a homogenizer available from Nippon Seiki Co., Ltd. for 5 minutes at revolutions of 10,000, to prepare a photopolymerizable composition emulsion (1).

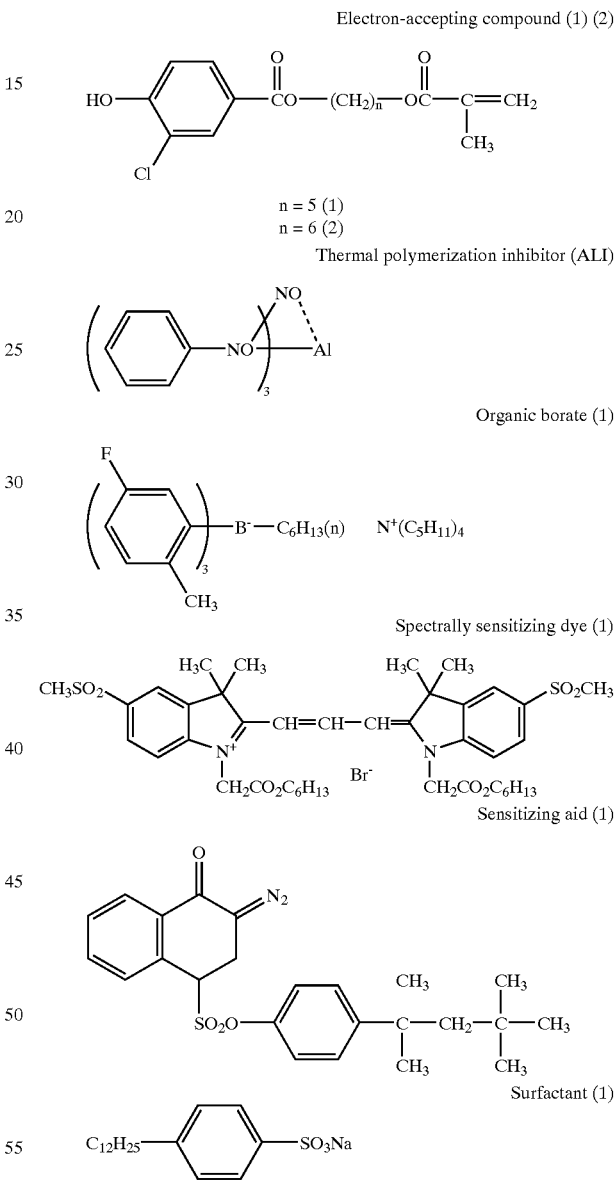

(2-b) Preparation of Photopolymerizable Composition Emulsion (2)

A photopolymerizable composition emulsion (2) was prepared in the same manner as the above-mentioned (2-a) except for using 0.311 g of the following organic borate (2) having a melting point of less than 25° C. instead of the organic borate (1).

Organic borate (2)

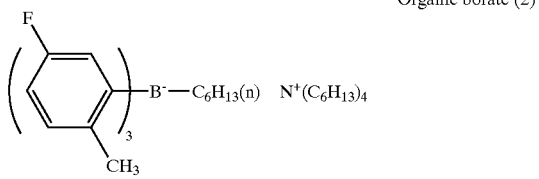

(2-c) Preparation of Photopolymerizable Composition Emulsion (3)

A photopolymerizable composition emulsion (3) was prepared in the same manner as the above-mentioned (2-a) except for using 0.317 g of the following organic borate (3) having a melting point of 55° C. instead of the organic borate (1).

Organic borate (3)

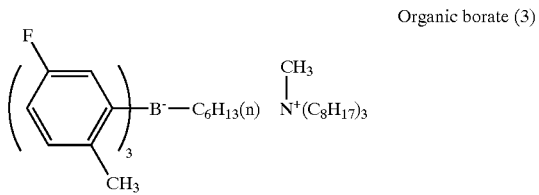

(2-d) Preparation of Photopolymerizable Composition Emulsion (4)

A photopolymerizable composition emulsion (4) was prepared in the same manner as the above-mentioned (2-a) except for using 0.295 g of the organic borate (3) instead of the organic borate (1) and for using 0.04 g of the following spectrally sensitizing dye (2) instead of the spectrally sensitizing dye (1).

Spectrally sensitizing dye (2)

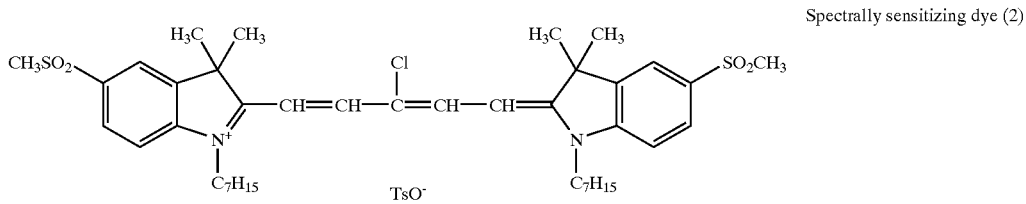

(2-e) Preparation of Photopolymerizable Composition Emulsion (5)

A photopolymerizable composition emulsion (5) was prepared in the same manner as the above-mentioned (2-a) except for using 0.266 g of the following organic borate (0) having a melting point of 121° C. instead of the organic borate (1).

Organic borate (0)

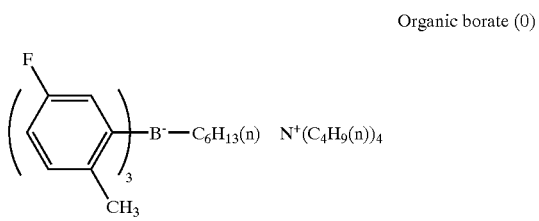

(2-f) Preparation of Photopolymerizable Composition Emulsion (6)

A photopolymerizable composition emulsion (6) was prepared in the same manner as the above-mentioned (2-a) except for using 0.248 g of the organic borate (0) instead of the organic borate (1) and for using 0.04 g of the spectrally sensitizing dye (2) instead of the spectrally sensitizing dye (1).

<Preparation of Light and Heat Sensitive Recording Layer Coating Liquid>

(3-a) Preparation of Light and Heat Sensitive Recording Layer Coating Liquid (1)—[Magenta]

4 g of the electron-donating colorless dye-enclosing microcapsule liquid (I), 12 g of the photopolymerizable composition emulsion (1), and 12 g of a 15% gelatin aqueous solution were mixed to prepare a light and heat sensitive recording layer coating liquid (1).

(3-b) Preparation of Light and Heat Sensitive Recording Layer Coating Liquid (2)—[Magenta]

4 g of the electron-donating colorless dye-enclosing microcapsule liquid (I), 12 g of the photopolymerizable composition emulsion (2), and 12 g of a 15% gelatin aqueous solution were mixed to prepare a light and heat sensitive recording layer coating liquid (2).

(3-c) Preparation of Light and Heat Sensitive Recording Layer Coating Liquid (3)—[Magenta]

4 g of the electron-donating colorless dye-enclosing microcapsule liquid (I), 12 g of the photopolymerizable composition emulsion (3), and 12 g of a 15% gelatin aqueous solution were mixed to prepare a light and heat sensitive recording layer coating liquid (3).

(3-d) Preparation of Light and Heat Sensitive Recording Layer Coating Liquid (4)—[Cyan]

4 g of the electron-donating colorless dye-enclosing microcapsule liquid (II), 12 g of the photopolymerizable composition emulsion (4), and 12 g of a 15% gelatin aqueous solution were mixed to prepare a light and heat sensitive recording layer coating liquid (4).

(3-e) Preparation of Light and Heat Sensitive Recording Layer Coating Liquid (5)—[Magenta]

4 g of the electron-donating colorless dye-enclosing microcapsule liquid (I), 12 g of the photopolymerizable composition emulsion (5), and 12 g of a 15% gelatin aqueous solution were mixed to prepare a light and heat sensitive recording layer coating liquid (5).

(3-f) Preparation of Light and Heat Sensitive Recording Layer Coating Liquid (6)—[Cyan]

4 g of the electron-donating colorless dye-enclosing microcapsule liquid (II), 12 g of the photopolymerizable composition emulsion (6), and 12 g of a 15% gelatin aqueous solution were mixed to prepare a light and heat sensitive recording layer coating liquid (6).

<Preparation of Protective Layer Coating Liquid>

182 g of an 8% aqueous solution of PVA (R 1130 available from Kuraray Co. Ltd.) was mixed with 29 g of distilled water, 4.4 g of a 2% aqueous solution of the following surfactant (2), 8.8 g of a 2% aqueous solution of the following surfactant (3), and 80 g of a 4% aqueous solution of a vinylsulfone compound (hardening agent), to prepare a protective layer coating liquid (1).

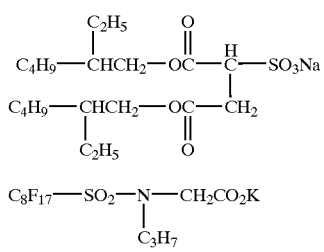

Surfactant (2)

C₈F₁₇—SO₂—N(C₃H₇)—CH₂CO₂K

Surfactant (3)

Example 1
Magenta Color Development

The light and heat sensitive recording layer coating liquid (1) was applied onto a WP support having a thickness of 198 μm by a coating bar such that the dry mass of entire coating was 7 g/m², and dried.

The protective layer coating liquid (1) was applied onto thus-formed layer by a coating bar such that the dry mass of the coating was 2 g/m², and dried to produce a recording material (1).

The protective layer side of the recording material (1) was irradiated by a semiconductor solid-state laser having a wavelength of 532 nm in a step wedge shape such that the maximum irradiation energy was 0.82 mJ/cm² and the irradiation energy was gradually changed.

The recording material, in which a latent image was formed by the irradiation, was heated by a hot plate at 105° C. for 10 seconds. Then, entire surface of the recording layer of the recording material was irradiated for 40 seconds while heating the recording material at 70° C. on a high-intensity schaukasten of 38,000 lux. As a result, the color was clearly developed, and a step wedge-shaped image having a background portion high in whiteness was obtained.

<Evaluation of Sensitivity>

In one step of the wedge-shaped image of each material corresponding to the same exposure amount, an energy difference of [an energy required for forming the background portion of each material]—[the irradiation energy in the step] was measured and evaluated to be an index of the sensitivity.

Thus, the smaller the obtained value, the higher the sensitivity is. The results are shown in table 1.

<Evaluation of Storage Stability>

The recording material was put in a light-shielding box and the box was placed in a room with a constant temperature of 10° C. and a constant humidity of 15% for 3 days, and the storage stability of laser recording was evaluated under the above-mentioned conditions. Then, the recorded step wedge-shaped portion was measured with respect to density by X-rite (manufactured by X-rite Co.), and the colored portion having a color density of approximately 0.8 was observed macroscopically and microscopically, to judge the presence of precipitation. The results are shown in table 1.

<Measurement of Density>

The color density (Dmax) and fogging in the background portion (Dmin) were measured by X-Rite (manufactured by X-Rite Co.). The results are shown in table 1.

Example 2
Magenta Color Development

The light and heat sensitive recording layer coating liquid (2) was applied in the same manner as Example 1, to produce a recording material (2). The recording material (2) was evaluated in the same manner as Example 1. The results are shown in table 1.

Example 3
Magenta Color Development

The light and heat sensitive recording layer coating liquid (3) was applied in the same manner as Example 1, to produce a recording material (3). The recording material (3) was evaluated in the same manner as Example 1. The results are shown in table 1.

Example 4
Cyan Color Development

The light and heat sensitive recording layer coating liquid (4) was applied onto a WP support having a thickness of 198 μm by a coating bar such that the dry mass of entire coating was 4.3 g/m², and dried.

The protective layer coating liquid (1) was applied onto thus-formed layer by a coating bar such that the dry mass of the coating was 2g/m², and dried to produce a recording material (4).

The protective layer side of the recording material (4) was irradiated by a semiconductor solid-state laser having a wavelength of 657 nm in a step wedge shape such that the maximum irradiation energy was 0.54 mJ/cm² and the irradiation energy was gradually changed.

The recording material, in which a latent image was formed by the irradiation, was heated by a hot plate at 105° C. for 10 seconds. Then, entire surface of the recording layer of the recording material was irradiated for 40 seconds while heating the recording material at 70° C. on a high-intensity schaukasten of 38,000 lux. As a result, the color was clearly developed, and a step wedge-shaped image having a background portion high in whiteness was obtained.

The image was evaluated in the same manner as Example 1. The results are shown in table 1.

Comparative Example 1
Magenta Color Development

The light and heat sensitive recording layer coating liquid (5) was applied in the same manner as Example 1, to produce a recording material (5). The recording material (5) was evaluated in the same manner as Example 1. The results are shown in table 1.

Comparative Example 2
Cyan Color Development

The light and heat sensitive recording layer coating liquid (6) was applied in the same manner as Example 4, to produce a recording material (6). The recording material (6) was evaluated in the same manner as Example 4. The results are shown in table 1.

TABLE 1

| | Recording material | Organic borate | Sensitivity (mJ/cm²) | Dmax | Dmin (*1) | Storage stability Presence or absence of precipitation observed microscopically |
|---|---|---|---|---|---|---|
| Example 1 | Recording material (1) | 1 | 0.28 | 2.10 | 0.09 (M) | Absence |
| Example 2 | Recording material (2) | 2 | 0.27 | 2.00 | 0.09 (M) | Absence |
| Example 3 | Recording material (3) | 3 | 0.28 | 2.10 | 0.08 (M) | Absence |

TABLE 1-continued

| | Recording material | Organic borate | Sensitivity (mJ/cm²) | Dmax | Dmin (*1) | Storage stability Presence or absence of precipitation observed microscopically |
|---|---|---|---|---|---|---|
| Example 4 | Recording material (4) | 3 | 0.14 | 2.40 | 0.09 (C) | Absence |
| Comparative Example 1 | Recording material (5) | 0 | 0.27 | 2.10 | 0.09 (M) | Presence |
| Comparative Example 2 | Recording material (6) | 0 | 0.14 | 2.41 | 0.09 (C) | Presence |

(*1)Macbeth density of remaining color in each dye (magenta, cyan) M/magenta, C/cyan As clear from Table 1, the recording materials of Examples 1 to 4 according to the invention were high in the sensitivity, the color density and the background portion density, equally to the recording materials of Comparative Examples 1 and 2. Further, the recording materials of Examples to 4 exhibited remarkably improved storage stability without gradation of precipitation.

What is claimed is:

1. A photopolymerizable composition comprising a polymerizable compound having an ethylenic unsaturated group, an organic borate represented by the following formula (1) and having a melting point of no more than 100° C., and a cationic compound that interacts with the organic borate:

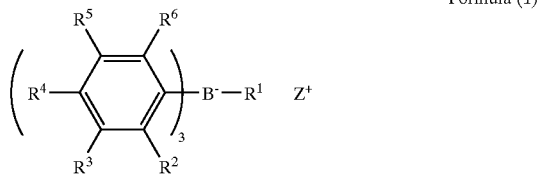

Formula (1)

wherein $R^1$ represents an alkyl group, $R^2$ represents an electron-donating group, $R^3$ to $R^6$ each represent a hydrogen atom or a substituent, the sum of Hammett's substituent constants σ of $R^2$ to $R^6$ is 0 to 1, and $Z^+$ represents a group that can form a cation.

2. The photopolymerizable composition of claim 1, wherein $Z^+$ in formula (1) is a tetralkyl ammonium represented by the following formula (2):

Formula (2)

wherein $R^7$ to $R^{10}$ independently represent a hydrocarbon group, and the sum of carbon atoms of $R^7$ to $R^{10}$ is at least 20.

3. The photopolymerizable composition of claim 1, wherein $R^1$ in formula (1) is a substituted or unsubstituted alkyl group having 1 to 30 carbon atoms.

4. The photopolymerizable composition of claim 1, wherein $R^2$ in formula (1) is a substituted or unsubstituted alkyl group having 1 to 30 carbon atoms or a substituted or unsubstituted alkoxy group having 1 to 30 carbon atoms.

5. The photopolymerizable composition of claim 1, wherein $R^3$ to $R^6$ in formula (1) independently represent a hydrogen atom, a halogen atom, a substituted or unsubstituted alkyl group, a substituted or unsubstituted aryl group, a substituted or unsubstituted alkenyl group, a substituted or unsubstituted alkynyl group, a substituted or unsubstituted alkoxy group, a substituted or unsubstituted aryloxy group, a substituted or unsubstituted alkoxycarbonyl group, a substituted or unsubstituted acyloxy group, a substituted or unsubstituted acylamino group, a substituted or unsubstituted carbamoyl group, a substituted or unsubstituted cyano group, a substituted or unsubstituted alkylsulfenyl group, a substituted or unsubstituted arylsulfenyl group, a substituted or unsubstituted alkylsulfinyl group, a substituted or unsubstituted arylsulfinyl group, a substituted or unsubstituted alkylsulfonyl group, a substituted or unsubstituted arylsulfonyl group, a substituted or unsubstituted sulfonamide group, a substituted or unsubstituted sulfamoyl group, a substituted or unsubstituted carboxy group, a substituted or unsubstituted sulfonate group, a substituted or unsubstituted acyl group, a substituted or unsubstituted silyl group, or a substituted or unsubstituted heterocyclic group.

6. The photopolymerizable composition of claim 1, wherein said organic borate is the following compound:

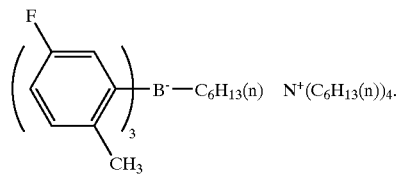

7. The photopolymerizable composition of claim 1, wherein said organic borate is the following compound:

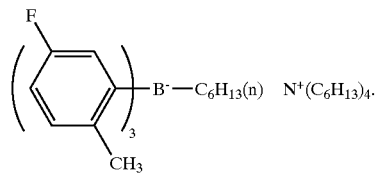

8. The photopolymerizable composition of claim 1, wherein said organic borate is the following compound:

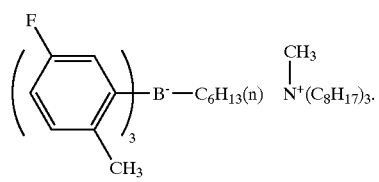

9. The photopolymerizable composition of claim 1, wherein, in formula (1), $R^1$ is a substituted or unsubstituted alkyl group having 1 to 30 carbon atoms; $R^2$ is a substituted or unsubstituted alkyl group having 1 to 30 carbon atoms or a substituted or unsubstituted alkoxy group having 1 to 30 carbon atoms; $R^3$ to $R^6$ independently represent a hydrogen atom, a halogen atom, a substituted or unsubstituted alkyl group, a substituted or unsubstituted aryl group, a substituted or unsubstituted alkenyl group, a substituted or unsubstituted alkynyl group, a substituted or unsubstituted alkoxy group, a substituted or unsubstituted aryloxy group, a substituted or unsubstituted alkoxycarbonyl group, a substituted or unsubstituted acyloxy group, a substituted or unsubstituted acylamino group, a substituted or unsubstituted carbamoyl group, a substituted or unsubstituted cyano group, a substituted or unsubstituted alkylsulfenyl group, a substituted or unsubstituted arylsulfenyl group, a substituted or unsubstituted alkylsulfinyl group, a substituted or unsubstituted arylsulfinyl group, a substituted or unsubstituted alkylsulfonyl group, a substituted or unsubstituted arylsulfonyl group, a substituted or unsubstituted sulfonamide group, a substituted or unsubstituted sulfamoyl group, a substituted or unsubstituted carboxy group, a substituted or unsubstituted sulfonate group, a substituted or unsubstituted acyl group, a substituted or unsubstituted silyl group, or a substituted or unsubstituted heterocyclic group; and $Z^+$ is a tetralkyl ammonium represented by the following formula (2):

$$N^+R^7R^8R^9R^{10}$$      Formula (2)

wherein $R^7$ to $R^{10}$ independently represent a hydrocarbon group, and the sum of carbon atoms of $R^7$ to $R^{10}$ is at least 20.

10. A recording material comprising a support, and a light and heat sensitive recording layer containing a color-developing component encapsulated in heat-responsive microcapsules and a photopolymerizable composition on the exterior of the heat-responsive microcapsules, wherein said photopolymerizable composition comprises a substantially colorless polymerizable compound having an ethylenic unsaturated group and a moiety that reacts with the color-developing component to form a color, an organic borate represented by the following formula (1) and having a melting point of no more than 100° C., and a cationic compound that interacts with the organic borate:

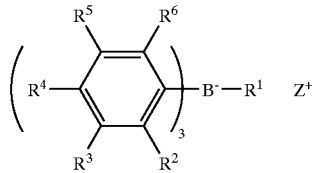

Formula (1)

wherein $R^1$ represents an alkyl group, $R^2$ represents an electron-donating group, $R^3$ to $R^6$ each represent a hydrogen atom or a substituent, the sum of Hammett's substituent constants σ of $R^2$ to $R^6$ is 0 to 1, and $Z^+$ represents a group that can form a cation.

11. The recording material of claim 10, wherein the recording material enables an image obtained by imagewise exposing the recording material to light so as to form a latent image thereon, and heating the exposed recording material so as to cause the color-developing component to form a color in accordance with the latent image to be fixed, and enables the colored cationic compound which interacts with the organic borate to be decolorized by exposing the entire surface of the recording material to light.

12. The recording material of claim 11, wherein $Z^+$ in formula (1) is a tetralkyl ammonium represented by the following formula (2):

$$N^+R^7R^8R^9R^{10}$$      Formula (2)

wherein $R^7$ to $R^{10}$ independently represent a hydrocarbon group, and the sum of carbon atoms of $R^7$ to $R^{10}$ is at least 20.

13. The recording material of claim 10, comprising a plurality of recording layers, each of which is respectively sensitive to light of different wavelengths and forms different colors.

14. The recording material of claim 12, comprising a plurality of recording layers, each of which is respectively sensitive to light of different wavelengths and forms different colors.

15. The recording material of claim 10, wherein $R^1$ in formula (1) is a substituted or unsubstituted alkyl group having 1 to 30 carbon atoms.

16. The recording material of claim 10, wherein $R^2$ in formula (1) is a substituted or unsubstituted alkyl group having 1 to 30 carbon atoms or a substituted or unsubstituted alkoxy group having 1 to 30 carbon atoms.

17. The recording material of claim 10, wherein $R^3$ to $R^6$ in formula (1) independently represent a hydrogen atom, a halogen atom, a substituted or unsubstituted alkyl group, a substituted or unsubstituted aryl group, a substituted or unsubstituted alkenyl group, a substituted or unsubstituted alkynyl group, a substituted or unsubstituted alkoxy group, a substituted or unsubstituted aryloxy group, a substituted or unsubstituted alkoxycarbonyl group, a substituted or unsubstituted acyloxy group, a substituted or unsubstituted acylamino group, a substituted or unsubstituted carbamoyl group, a substituted or unsubstituted cyano group, a substituted or unsubstituted alkylsulfenyl group, a substituted or unsubstituted arylsulfenyl group, a substituted or unsubstituted alkylsulfinyl group, a substituted or unsubstituted arylsulfinyl group, a substituted or unsubstituted alkylsulfonyl group, a substituted or unsubstituted arylsulfonyl group, a substituted or unsubstituted sulfonamide group, a substituted or unsubstituted sulfamoyl group, a substituted or unsubstituted carboxy group, a substituted or unsubstituted sulfonate group, a substituted or unsubstituted acyl group, a substituted or unsubstituted silyl group, or a substituted or unsubstituted heterocyclic group.

18. The recording material of claim 10, wherein said organic borate is the following compound:

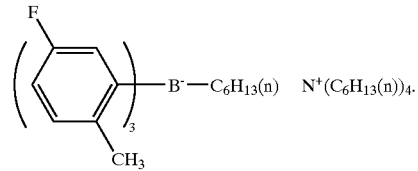

19. The recording material of claim 10, wherein said organic borate is the following compound:

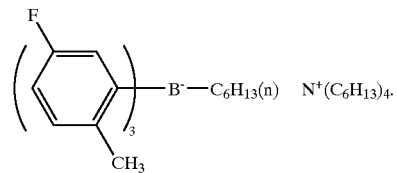

20. The recording material of claim 10, wherein said organic borate is the following compound:

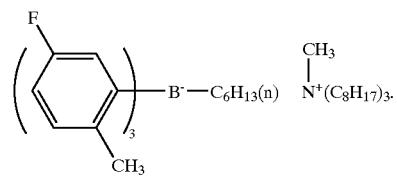

21. The recording material of claim 10, wherein, in formula (1), $R^1$ is a substituted or unsubstituted alkyl group having 1 to 30 carbon atoms; $R^2$ is a substituted or unsubstituted alkyl group having 1 to 30 carbon atoms or a substituted or unsubstituted alkoxy group having 1 to 30 carbon atoms; $R^3$ to $R^6$ independently represent a hydrogen atom, a halogen atom, a substituted or unsubstituted alkyl group, a substituted or unsubstituted aryl group, a substituted or unsubstituted alkenyl group, a substituted or unsubstituted alkynyl group, a substituted or unsubstituted alkoxy group, a substituted or unsubstituted aryloxy group, a substituted or unsubstituted alkoxycarbonyl group, a substituted or unsubstituted acyloxy group, a substituted or unsubstituted acylamino group, a substituted or unsubstituted carbamoyl group, a substituted or unsubstituted cyano group, a substituted or unsubstituted alkylsulfenyl group, a substituted or unsubstituted arylsulfenyl group, a substituted or unsubstituted alkylsulfinyl group, a substituted or unsubstituted arylsulfinyl group, a substituted or unsubstituted alkylsulfonyl group, a substituted or unsubstituted arylsulfonyl group, a substituted or unsubstituted sulfonamide group, a substituted or unsubstituted sulfamoyl group, a substituted or unsubstituted carboxy group, a substituted or unsubstituted sulfonate group, a substituted or unsubstituted acyl group, a substituted or unsubstituted silyl group, or a substituted or unsubstituted heterocyclic group; and $Z^+$ is a tetralkyl ammonium represented by the following formula (2):

$$N^+R^7R^8R^9R^{10} \qquad \text{Formula (2)}$$

wherein $R^7$ to $R^{10}$ independently represent a hydrocarbon group, and the sum of carbon atoms of $R^7$ to $R^{10}$ is at least 20.

* * * * *